(12) United States Patent
Takehara

(10) Patent No.: US 7,711,331 B2
(45) Date of Patent: May 4, 2010

(54) TRANSMISSION POWER AMPLIFIER APPARATUS FOR COMBINING POWER-AMPLIFIED CONSTANT AMPLITUDE SIGNALS EACH HAVING CONTROLLED CONSTANT AMPLITUDE VALUE AND PHASE

(75) Inventor: Hiroyasu Takehara, Osaka (JP)

(73) Assignee: Panasonic Corporation, Osaka (JP)

( * ) Notice: Subject to any disclaimer, the term of this patent is extended or adjusted under 35 U.S.C. 154(b) by 507 days.

(21) Appl. No.: 11/826,910

(22) Filed: Jul. 19, 2007

(65) Prior Publication Data

US 2008/0051044 A1 Feb. 28, 2008

(30) Foreign Application Priority Data

Jul. 19, 2006 (JP) ............................. 2006-196555

(51) Int. Cl.
*H04B 1/04* (2006.01)
(52) U.S. Cl. .................................. 455/103; 455/127.3
(58) Field of Classification Search .............. 455/127.1, 455/127.2, 127.3, 103; 330/278, 295
See application file for complete search history.

(56) References Cited

U.S. PATENT DOCUMENTS 5,287,069 A 2/1994 Okubo et al.

7,496,333 B2 * 2/2009 Matsuura et al. ............ 455/108
2007/0149151 A1 * 6/2007 Kim et al. ................ 455/127.1

FOREIGN PATENT DOCUMENTS

JP 6-22302 3/1994
JP 2758682 3/1998

OTHER PUBLICATIONS

"Linear Amplification with Nonlinear Components", IEEE Transactions on Communications, Dec. 1974, COM-22, pp. 1942-1945.

* cited by examiner

*Primary Examiner*—Nguyen Vo
(74) *Attorney, Agent, or Firm*—Wenderoth, Lind & Ponack, L.L.P.

(57) ABSTRACT

In a transmission power amplifier apparatus, a signal calculator divides an input signal into a plurality of N constant amplitude signals having a substantially identical predetermined constant amplitude value and having predetermined phases different from each other, and N power amplifiers amplify electric powers of the N constant amplitude signals under same predetermined operating condition. A power combiner combines the electric powers of the N power-amplified constant amplitude signals, and outputs a combined output signal. A controller controls the signal calculator to detect an amplitude value of the input signal, to detect an average value and one of a maximum value of the amplitude value of the input signal and a peak-to-peak value of the amplitude value for a unit time interval based on the detected amplitude value of the input signal, and to divide the input signal into the N constant amplitude signals having a constant amplitude value and different phases.

12 Claims, 24 Drawing Sheets

FIRST PREFERRED EMBODIMENT

Fig. 1 FIRST PREFERRED EMBODIMENT

Fig.5A

| AVERAGE VALUE OF AMPLITUDES A(t) FOR UNIT TIME INTERVAL \ MAXIMUM VALUE OF AMPLITUDES A(t) FOR UNIT TIME INTERVAL | Amax1 | Amax2 | ... | AmaxI |
|---|---|---|---|---|
| Aave1 | Acont11 | Acont21 | ... | AcontI1 |
| Aave2 | Acont12 | Acont22 | ... | AcontI2 |
| ... | ... | ... | ... | ... |
| AaveJ | Acont1J | Acont2J | ... | AcontIJ |

Fig.5B

| CONSTANT AMPLITUDE VALUE \ AMPLITUDES VALUE OF MODULATED SIGNAL S(t) | A1 | A2 | ... | AK |
|---|---|---|---|---|
| Acont1 | $\phi 11$ | $\phi 21$ | ... | $\phi K1$ |
| Acont2 | $\phi 12$ | $\phi 22$ | ... | $\phi K2$ |
| ... | ... | ... | ... | ... |
| AcontL | $\phi 1L$ | $\phi 2L$ | ... | $\phi KL$ |

Fig.5C

| CONSTANT AMPLITUDE VALUE | POWER SUPPLY VOLTAGE | BIAS POINT ADJUSTMENT VOLTAGE |
|---|---|---|
| Acont1 | V1 | B1 |
| Acont2 | V2 | B2 |
| ... | ... | ... |
| AcontL | VL | BL |

EXAMPLE OF DIGITALLY MODULATED SIGNAL 301 MODULATED
BY OFDM METHOD AND AVERAGE VALUE 302 THEREOF

EXAMPLE OF PEAK-TO-PEAK VALUE 303 OF DIGITALLY MODULATED
SIGNAL 301 DETECTED FOR EACH OF UNIT TIME INTERVALS

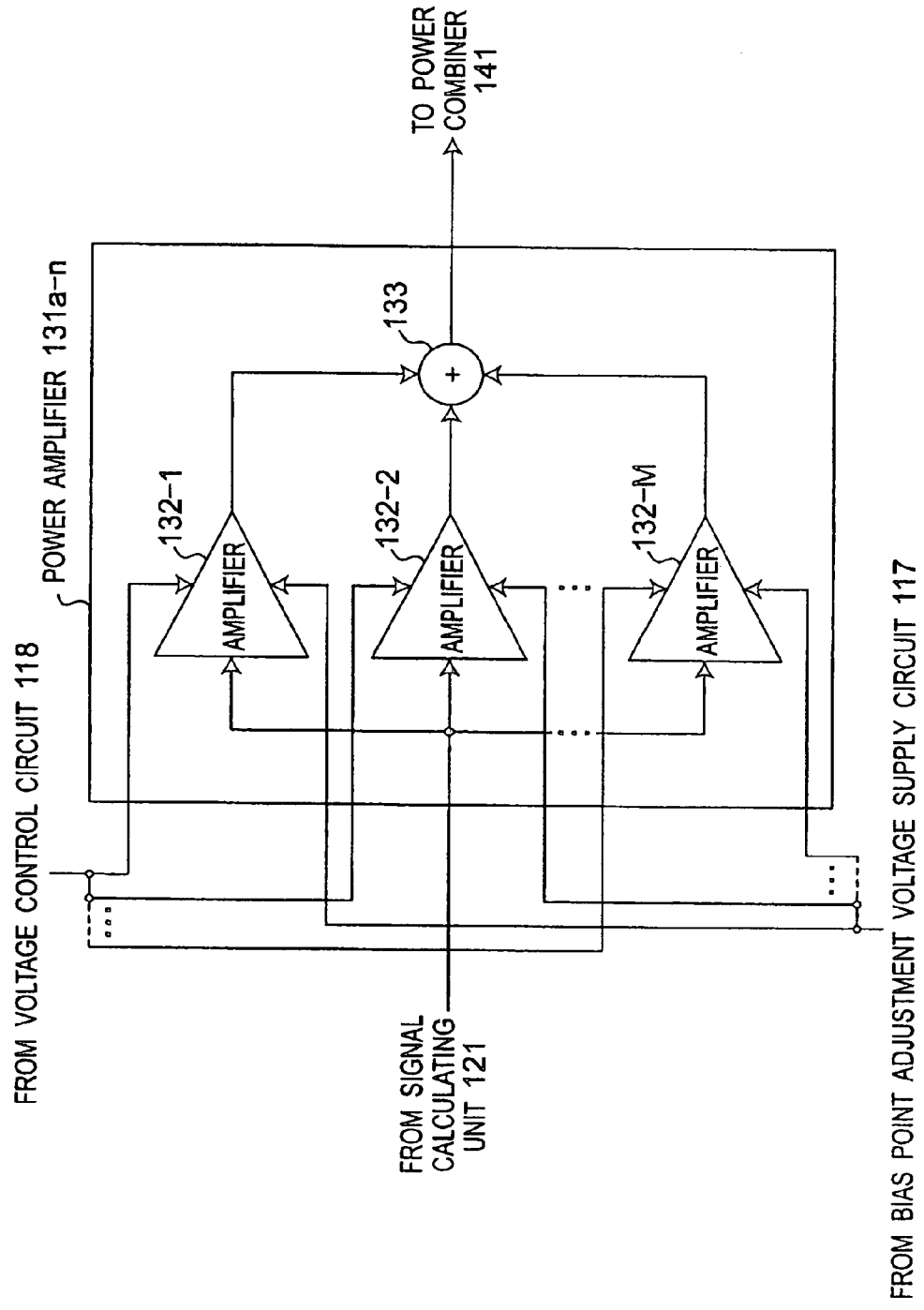
Fig. 13 MODIFIED PREFERRED EMBODIMENT OF POWER AMPLIFIER 131-n SHOWN IN FIG.3

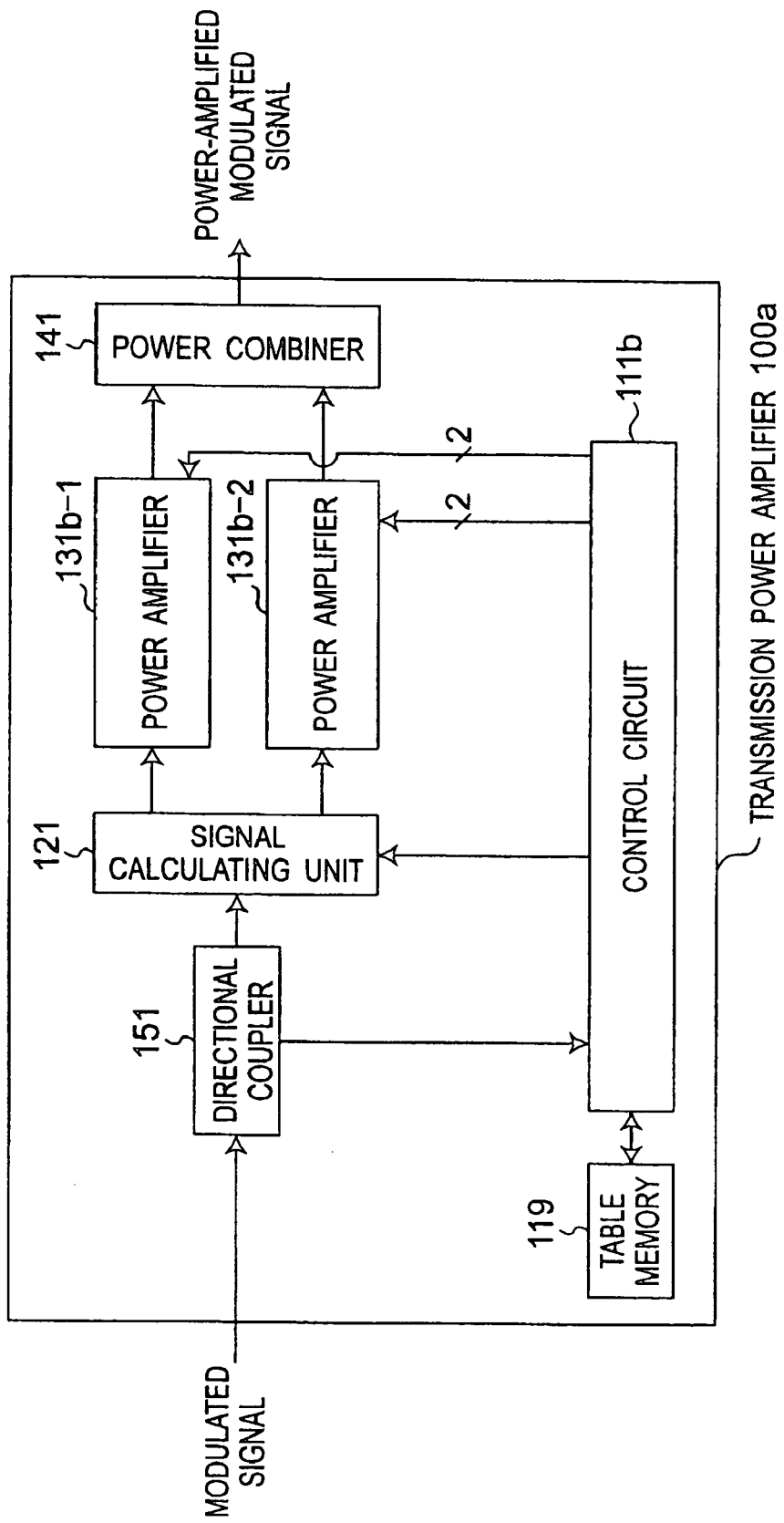

Fig. 17 SECOND PREFERRED EMBODIMENT

Fig. 19 THIRD PREFERRED EMBODIMENT

Fig.22 FIFTH PREFERRED EMBODIMENT

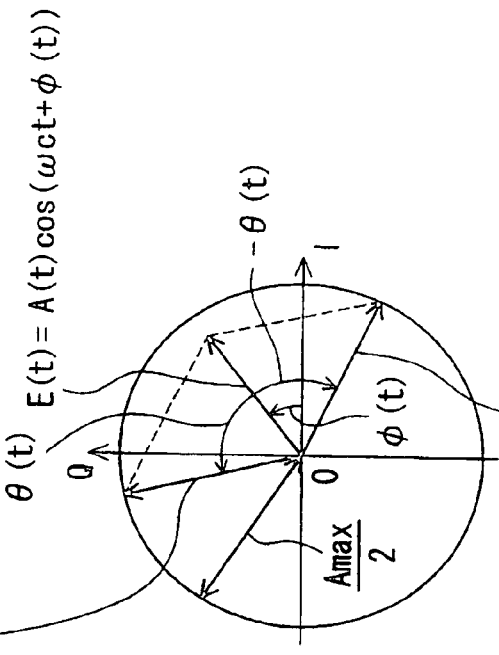

Fig. 24B PRIOR ART

WHEN AMPLITUDE OF COMBINED OUTPUT SIGNAL IS SMALL $S1(t) = \frac{Amax}{2}[\cos(\omega ct + \phi(t) + \theta(t))]$ $E(t) = A(t)\cos(\omega ct + \phi(t))$ $S2(t) = \frac{Amax}{2}[\cos(\omega ct + \phi(t) - \theta(t))]$ $\theta(t) = \cos^{-1}\left(\frac{A(t)}{Amax}\right)$

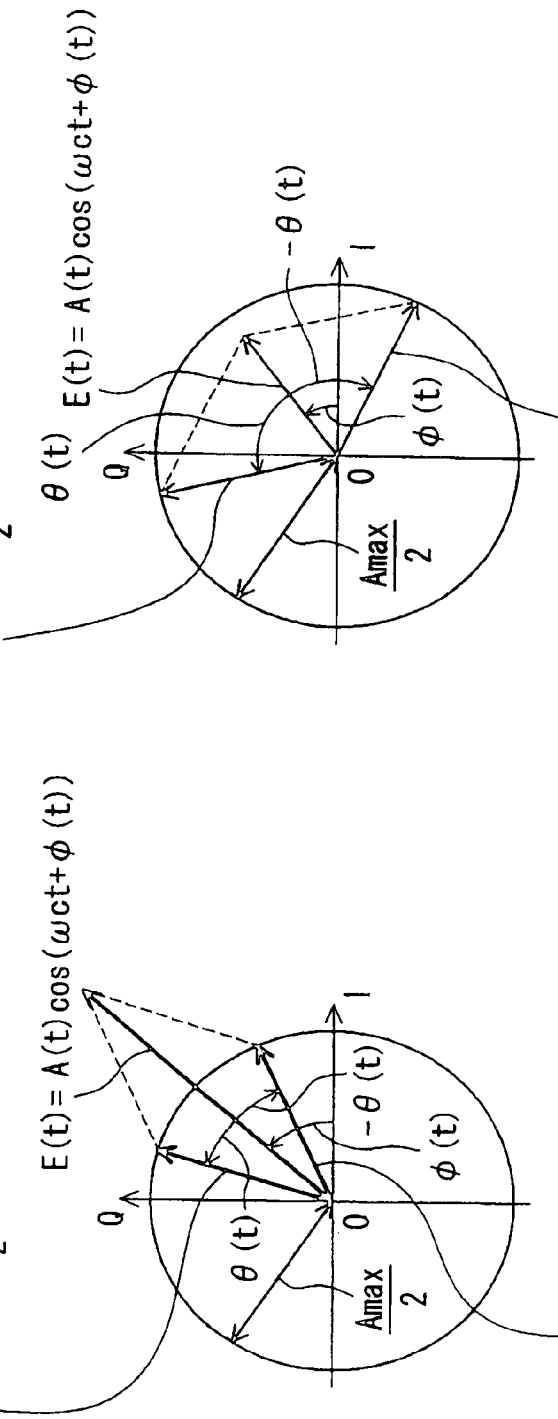

Fig. 24A PRIOR ART

PRIOR ART

WHEN AMPLITUDE OF COMBINED OUTPUT SIGNAL IS LARGE $S1(t) = \frac{Amax}{2}[\cos(\omega ct + \phi(t) + \theta(t))]$ $E(t) = A(t)\cos(\omega ct + \phi(t))$ $S2(t) = \frac{Amax}{2}[\cos(\omega ct + \phi(t) - \theta(t))]$ $\theta(t) = \cos^{-1}\left(\frac{A(t)}{Amax}\right)$

TRANSMISSION POWER AMPLIFIER APPARATUS FOR COMBINING POWER-AMPLIFIED CONSTANT AMPLITUDE SIGNALS EACH HAVING CONTROLLED CONSTANT AMPLITUDE VALUE AND PHASE

FIELD OF THE INVENTION

The present invention relates to a transmission power amplifier apparatus provided in, for example, a radio communication apparatus and power amplifying an inputted radio transmission signal, a method of controlling the transmission power amplifier apparatus, and a radio communication apparatus using the transmission power amplifier apparatus.

BACKGROUND OF THE INVENTION

In recent years, it has been required to communicate a large capacity of data at high speed in a radio communication, and demand for transmitting a multi-valued digitally-modulated signal rises accordingly. Generally speaking, transmission information is superimposed not only on a phase component but also on an amplitude component in the multi-valued digitally-modulated signal. Due to this, a radio transmitter apparatus transmitting the multi-valued digitally-modulated signal is required to have a quite high linearity. On the other hand, as portable radio communication apparatuses typified by a mobile telephone have become popular, the radio transmitter apparatus is required to realize low power consumption, that is, a transmission power amplifier apparatus is required to operate with high efficiency. Generally speaking, the linearity and the highly efficient operation of the transmission power amplifier apparatus hold a trade-off relationship. If electric power is amplified while giving greater importance to the linearity, the power added efficiency tends to be sacrificed. If electric power is amplified while giving greater importance to the power added efficiency, the linearity tends to be sacrificed.

Various methods have been conventionally proposed to satisfy both the linearity and the highly efficient operation for the power amplifier. As one of power amplifying methods according to a prior art, there has been known a method of linear amplification using nonlinear components (referred to as a LINC method hereinafter). A LINC amplifier performs a vector resolution to divide a modulated signal an amplitude component of which temporally changes into two constant amplitude signals with an arbitrary phase difference between them, amplifies each of the constant amplitude signals using a nonlinear amplifier capable of performing highly efficient amplification, and then performs a vector combination, and this leads to satisfying both the linearity and the high efficiency. The LINC is advocated by D. C. Cox and disclosed in D. C. Cox, "Linear amplification with nonlinear components", IEEE transactions on communications, December 1974, COM-22, pp. 1942-1945. Furthermore, an applied LINC amplifier is disclosed in Japanese Examined Patent Publication No. 6-22302, Japanese Patent No. 2758682, and U.S. Pat. No. 5,287,069.

FIG. 23 is a block diagram showing a configuration of a LINC amplifier 10 according to a prior art. FIG. 24A shows an example of a vector combination when an amplitude value of a combined output signal of the LINC amplifier 10 shown in FIG. 23 is large. FIG. 24B shows an example of the vector combination when the amplitude value of the combined output signal of the LINC amplifier 10 shown in FIG. 23 is small. Referring to FIG. 23, the LINC amplifier 10 is configured to include a signal calculating unit 21 that performs a vector resolution to divide a modulated signal having a temporally-changing amplitude value into two constant amplitude signals, power amplifiers 31 and 32 that amplify the two constant amplitude signals, respectively, and a power combiner 41 that combines signals outputted from the power amplifiers 31 and 32, generates a combined output signal, and outputs the combined output signal. In this case, when a modulated signal S(t) inputted to the LINC amplifier 10 is represented by the following Equation (1), constant amplitude signals $S1(t)$ and $S2(t)$ outputted from the signal calculating unit 21 to the power amplifiers 31 and 32 are represented by the following Equations (2) and (3) as shown in FIGS. 24A and 24B, respectively:

$$S(t) = A(t)\cos(\omega_c t + \phi(t)), \tag{1}$$

$$S1(t) = \frac{A\max}{2}\cos(\omega_c t + \phi(t) + \theta(t)), \tag{2}$$

and $$S2(t) = \frac{A\max}{2}\cos(\omega_c t + \phi(t) - \theta(t)), \tag{3}$$

where the phase $\theta(t)$ is represented by the following Equation (4):

$$\theta(t) = \cos^{-1}\left(\frac{A(t)}{A\max}\right), \tag{4}$$

where $A(t)$ denotes an amplitude of the modulated signal $S(t)$, $\omega c$ denotes a carrier frequency of the modulated signal $S(t)$, $\phi(t)$ denotes a phase of the modulated signal $S(t)$, Amax denotes a maximum value of the amplitude of the modulated signal $S(t)$, and $\theta(t)$ denotes a phase difference between each of the constant amplitude signals $S1(t)$ and $S2(t)$ and the modulated signal $S(t)$.

As can be seen from above, the modulated signal $S(t)$ is divided into the two constant amplitude signals $S1(t)$ and $S2(t)$ each having a constant amplitude Amax/2. As the power amplifiers 31 and 32, nonlinear amplifiers capable of performing highly efficient operation can be employed. Therefore, the LINC amplifier 10 according to the prior art can realize a linear amplification operation as a whole of the LINC amplifier 10, using the nonlinear amplifiers capable of performing highly efficient operation.

However, the LINC amplifier 10 according to the prior art has the following problems if, for example, the inputted modulated signal S(t) is a multi-valued digitally-modulated signal in which transmission information is superimposed on an amplitude component, and a dynamic range indicating a change width of an amplitude is wide, or when the combined output signal is obtained in a wide range from a low output to high output, e.g., a peak to average ratio (referred to as a PAR hereinafter) is high, in particular, when the low output is obtained. As shown in FIG. 24B, when the amplitude of a combined output signal E(t) after electric power combination is small, that is, the amplitude of the modulated signal S(t) is small, then the phase difference is greater between the two constant amplitude signals $S1(t)$ and $S2(t)$, reactive power at the time of power combination by the power combiner 41 increases, and combined loss increases. Therefore, even if the power amplifiers 31 and 32 perform highly efficient nonlinear amplification on the respective constant amplitude signals S1(*t*) and S2(*t*), the overall efficiency of the LINC amplifier 10 is not so improved.

SUMMARY OF THE INVENTION

It is an essential object of the present invention to provide a transmission power amplifier apparatus capable of solving the above-stated problems, and highly efficiently amplifying an input signal substantially linearly when the dynamic range of the amplitude of the input signal is relatively wide or a PAR is relatively large.

It is another object of the present invention to provide a method of controlling the transmission power amplifier apparatus capable of solving the above-stated problems, and highly efficiently amplifying an input signal substantially linearly when the dynamic range of the amplitude of the input signal is relatively wide or a PAR is relatively large.

It is a further object of the present invention to provide a radio communication apparatus using the transmission power amplifier apparatus.

According to the first aspect of the present invention, there is provided a transmission power amplifier apparatus including a signal calculator, N power amplifiers, a power combiner, and controller. The signal calculator divides an input signal into a plurality of N constant amplitude signals having a substantially identical predetermined constant amplitude value and having predetermined phases different from each other, and the N power amplifiers amplify electric powers of the N constant amplitude signals under same predetermined operating condition. The power combiner combines the electric powers of the N power-amplified constant amplitude signals, and outputs a combined output signal, and the controller controls the signal calculator, (a) to detect an amplitude value of the input signal, (b) to detect an average value and one of a maximum value of the amplitude value of the input signal and a peak-to-peak value of the amplitude value for a unit time interval based on the detected amplitude value of the input signal, (c) to decide the constant amplitude value of the N constant amplitude signals for the unit time interval so as to suppress a combined loss caused by the power combiner based on the detected average value and one of the detected maximum value and the detected peak-to-peak value, (d) to decide the phases of the N constant amplitude signals so as to divide the input signal into the N constant amplitude signals having the decided constant amplitude value and the decided different phases based on the decided constant amplitude value and the amplitude value of the input signal, and (e) to divide the input signal into the N constant amplitude signals having the decided constant amplitude value and the decided different phases.

The above-mentioned transmission power amplifier apparatus further includes a table memory which previously stores a first lookup table and a second lookup table. The first lookup table shows a relationship between the detected average value and maximum value or the detected peak-to-peak value and the constant amplitude value of the N constant amplitude signals, and the second lookup table shows a relationship of the constant amplitude value and the amplitude value of the input signal to each of the phases of the N constant amplitude signals. The controller decides the constant amplitude value of the N constant amplitude signals and the phases of the N constant amplitude signals with reference to the first lookup table and the second lookup table.

In the above-mentioned transmission power amplifier apparatus, the controller decides the constant amplitude value of the N constant amplitude signals and the phases of the N constant amplitude signals by calculation.

In the above-mentioned transmission power amplifier apparatus, the controller controls the N power amplifiers to decide the operating condition for the N power amplifiers for the unit time interval so that the N power amplifiers operate near a maximum efficient point based on the decided constant amplitude value.

In the above-mentioned transmission power amplifier apparatus, the operating condition for the N power amplifiers is at least one of bias points of the respective N power amplifiers and power supply voltages of the respective N power amplifiers.

In the above-mentioned transmission power amplifier apparatus, each of the N power amplifiers include a plurality of amplifier connected in series.

In the above-mentioned transmission power amplifier apparatus, each of the N power amplifiers includes a plurality of amplifier connected in parallel.

The above-mentioned transmission power amplifier apparatus further includes a digital modulator which converts an I signal and a Q signal orthogonal to each other into a modulated signal, and outputs the modulated signal to the signal calculator as the input signal. The controller includes an I and Q components decoder for detecting the amplitude value of the input signal based on the I and Q signals.

The above-mentioned transmission power amplifier apparatus further includes a baseband processor and a digital modulator. The baseband processor converts inputted digital data into an I signal and a Q signal orthogonal to each other, and outputs the I and Q signals. The digital modulator converts the I and Q signals from the baseband processor into a modulated signal, and outputs the modulated signal to the signal calculator as the input signal. The controller includes modulated amplitude calculator for detecting the amplitude value of the input signal based on the digital data.

According to the second aspect of the present invention, there is provided a method of controlling a transmission power amplifier apparatus. The method includes steps of:

performing a signal calculating processing for dividing an input signal into a plurality of N constant amplitude signals having a substantially identical predetermined constant amplitude value and having predetermined phases different from each other;

amplifying electric powers of the N constant amplitude signals under substantially the same predetermined operating condition, respectively;

combining the electric powers of the N power-amplified constant amplitude signals, and outputting a combined output signal;

controlling the step of performing the signal calculating processing, (a) to detect an amplitude value of the input signal, (b) to detect an average value and one of a maximum value of the amplitude value of the input signal and a peak-to-peak value of the amplitude value for a unit time interval based on the detected amplitude value of the input signal, (c) to decide the constant amplitude value of the N constant amplitude signals for the unit time interval so as to suppress a combined loss at the step of combining the electric powers based on the detected average value and one of the detected maximum value and the detected peak-to-peak value, (d) to decide the phases of the N constant amplitude signals so as to divide the input signal into the N constant amplitude signals having the decided constant amplitude value and the decided different phases based on the decided constant amplitude value and the amplitude value of the input signal, and (e) to divide the input signal into the N constant amplitude signals having the decided constant amplitude value and the decided different phases.

According to the third aspect of the present invention, there is provided a radio communication apparatus including a transmitter circuit, and the above-mentioned transmission power amplifier apparatus.

According to the fourth aspect of the present invention, there is provided a radio communication apparatus includes a transceiver circuit for generating and outputting a predetermined radio signal, and receiving a radio signal from a transmitter side, and the above-mentioned transmission power amplifier apparatus.

Accordingly, the transmission power amplifier apparatus according to the present invention includes the signal calculator that divides the input signal into a plurality of N constant amplitude signals having the substantially same predetermined constant amplitude value and the different predetermined phases, detects the average value and one of the maximum value of the amplitude of the input signal and the peak-to-peak value thereof for the predetermined unit time interval, and decides the amplitude value of the constant amplitude signal based on the detected average value and one of the detected maximum value and the detected peak-to-peak value so as to suppress the combined loss generated during power combination. Therefore, even if the dynamic range of the amplitude of the input signal is relatively wide or the PAR thereof is relatively large, the transmission power amplifier apparatus according to the present invention can amplify the power of the input signal with higher efficiency substantially linearly.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 5A shows an example of a lookup table, as referred to at step S3 shown in FIG. 4, showing the relationship of a constant amplitude value Acont to the maximum value Amax and average value Aave of an amplitude A(t) of a modulated signal S(t) for a unit time interval;

FIG. 5B shows an example of a lookup table, as referred to at step S6 shown in FIG. 4, showing the relationship of a phase difference φ between two constant amplitude signals to the amplitude A(t) and the constant amplitude value Acont of the modulated signal S(t) if N is 2 (N=2);

FIG. 5C shows an example of a lookup table, as referred to at step S4 shown in FIG. 4, showing the relationship of bias point adjustment voltages B and power supply voltages V of M stages of amplifiers 132-$m$ within each of N power amplifiers 131-$n$, to the constant amplitude values Acont;

FIG. 13 is a block diagram showing a configuration of a power amplifier 131$a$-$n$ that is a modified preferred embodiment of the N power amplifiers 131-$n$ shown in FIG. 3;

FIG. 14 is a block diagram showing a configuration of a transmission power amplifier apparatus 100$a$ according to a modified preferred embodiment of the first preferred embodiment of the present invention;

FIG. 24A shows an example of a vector combination when an amplitude value of a combined output signal of the LINC amplifier 10 shown in FIG. 23 is large; and FIG. 24B shows an example of the vector combination when the amplitude value of the combined output signal of the LINC amplifier 10 shown in FIG. 16 is small.

DESCRIPTION OF THE PREFERRED EMBODIMENTS

Preferred embodiments of the present invention will be described hereinafter with reference to the accompanying drawings. In the following preferred embodiments, like components are denoted by the same reference symbols.

First Preferred Embodiment

Figure 1:
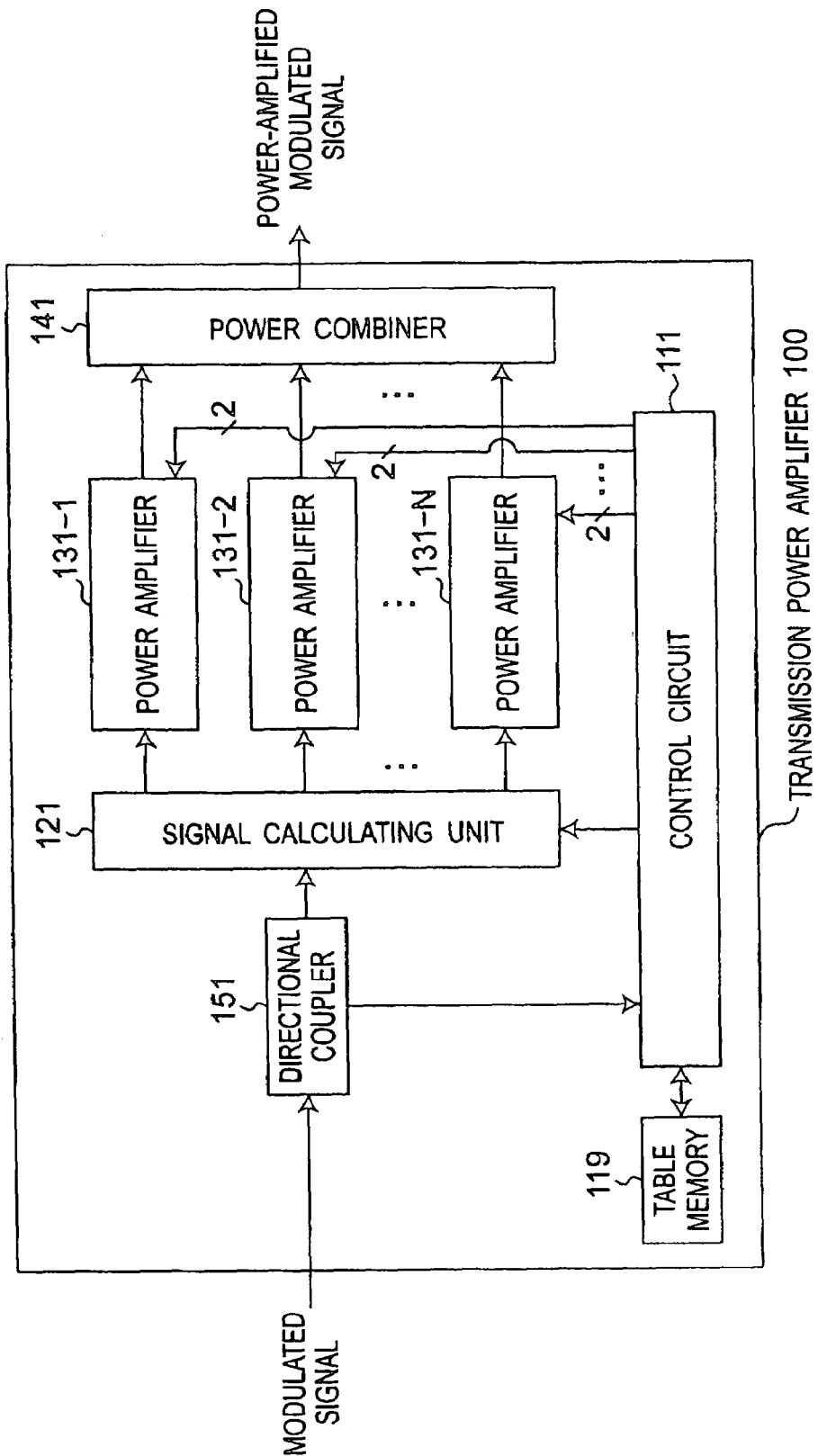
FIG. 1 is a block diagram showing a configuration of a transmission power amplifier apparatus 100 according to a first preferred embodiment of the present invention.
Figure 2:
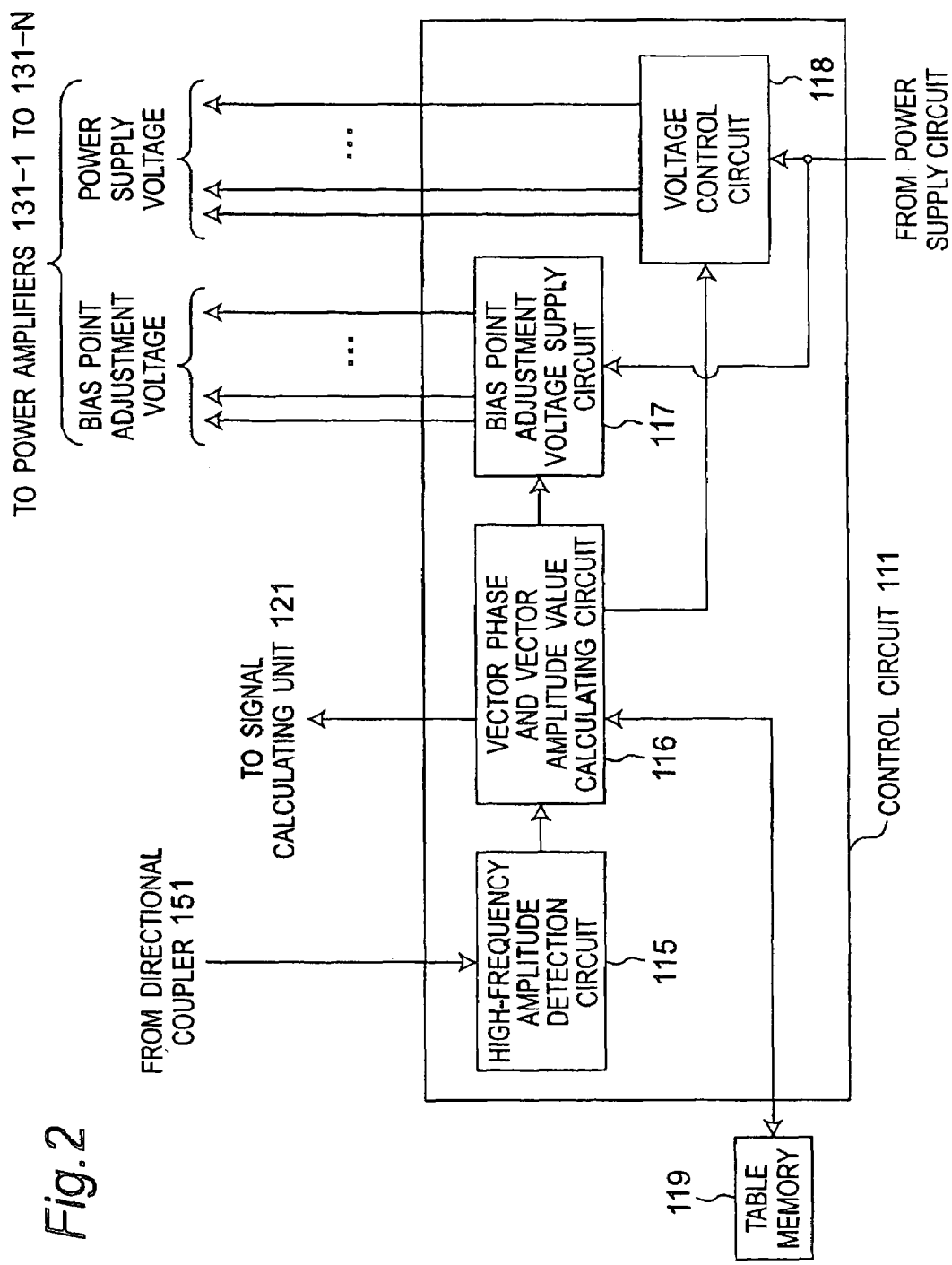
FIG. 2 is a block diagram showing a configuration of a control circuit 111 shown in FIG. 1.
Figure 3:
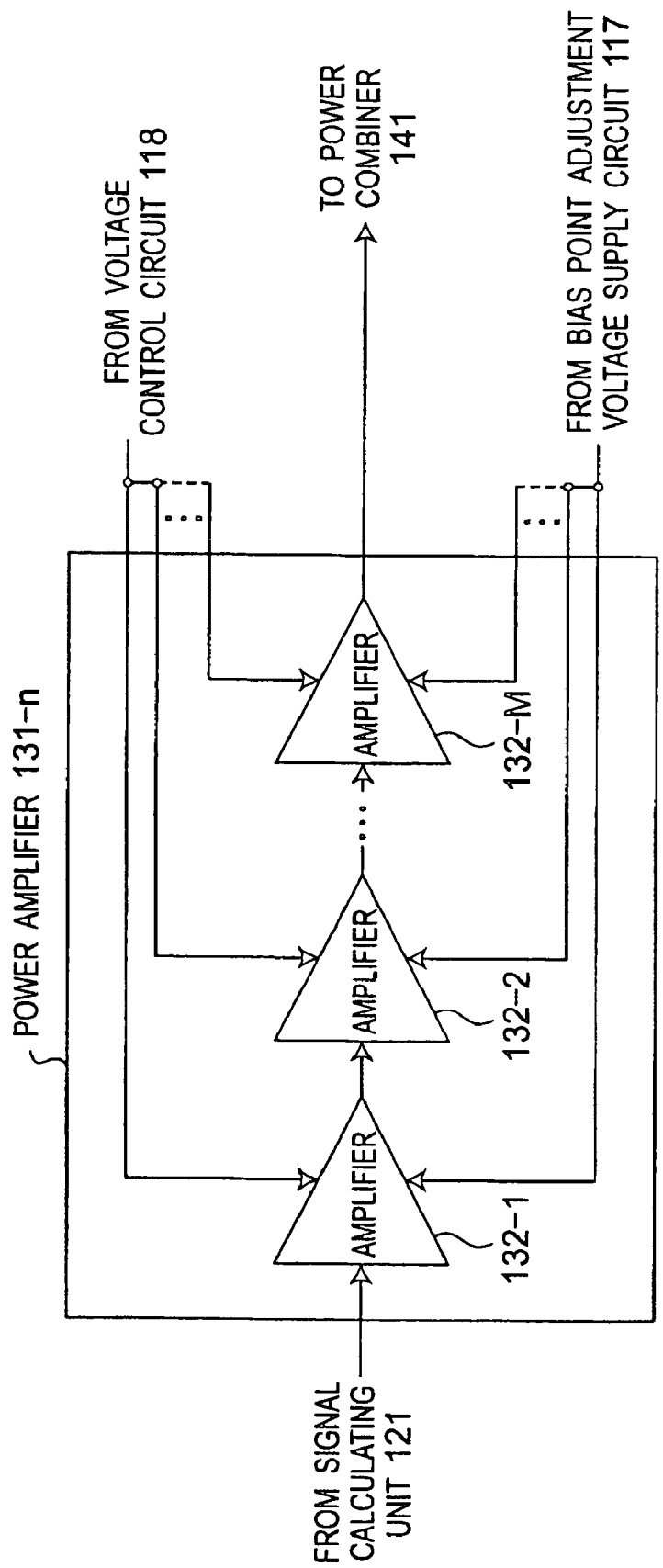
FIG. 3 is a block diagram showing a configuration of a plurality of or N power amplifiers 131-$n$ (where n=1, 2, ..., N) shown in FIG. 1.

FIG. 1 is a block diagram showing a configuration of a transmission power amplifier apparatus 100 according to a first preferred embodiment of the present invention. FIG. 2 is a block diagram showing a configuration of a control circuit 111 shown in FIG. 1. FIG. 3 is a block diagram showing a configuration of a plurality of or N power amplifiers 131-$n$ (where n=1, 2, ..., N) shown in FIG. 1. Referring to FIG. 1, the transmission power amplifier apparatus 100 is characterized by including a directional coupler 151, a signal calculating unit 121, N power amplifiers 131-$n$, a power combiner 141, a control circuit 111, and a table memory 119. Referring to FIG. 2, the control circuit 111 is configured to include a high-frequency amplitude detection circuit 115, a vector phase and vector amplitude value calculating circuit 116, a bias point adjustment voltage supply circuit 117, and a voltage control circuit 118. Referring to FIG. 3, each of the N power amplifiers 131-$n$ is configured to include a plurality of or M stages of amplifiers 132-$m$ (where m=1, 2, ..., M) connected in series. In the present preferred embodiment, each of the M stages of amplifiers 132-$m$ is a transistor power amplifier circuit having a grounded emitter.

The transmission power amplifier apparatus 100 according to the present preferred embodiment is characterized by including the control circuit 111 controlling the signal calculating unit 121 to detect an amplitude value of an input signal, to detect an average value and a maximum value of the amplitude value of the input signal for every unit time interval based on the detected amplitude value of the input signal, to decide a constant amplitude value of N constant amplitude signals for every unit time interval so as to suppress a combined loss generated in the power combiner 141 based on the detected average value and maximum value, to decide phases of the respective N constant amplitude signals so as to divide the input signal into the N constant amplitude signals having the decided constant amplitude value and the decided different phases based on the decided constant amplitude value and the amplitude value of the input signal, and to divide the input signal into the N constant amplitude signals having the decided constant amplitude value and the decided different phases.

Figure 8:
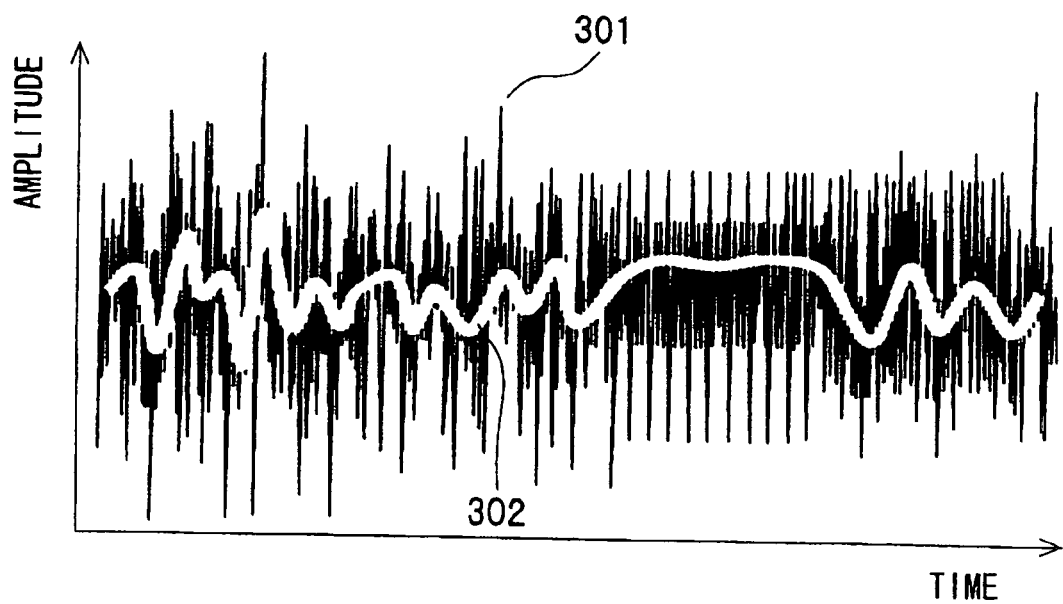
FIG. 8 is a graph showing an example of a digitally modulated signal 301 modulated by an OFDM method as an example of the modulated signal inputted to the transmission power amplifier apparatus 100 shown in FIG. 1 and an average value 302 thereof per every unit time interval.

FIG. 8 is a graph showing an example of a digitally modulated signal 301 modulated by OFDM (Orthogonal Frequency Division Multiplex) method, which signal 301 is an example of a modulated signal inputted to the transmission power amplifier apparatus 100 shown in FIG. 1, and an example of an average value 302 thereof for every unit time interval. As shown in FIG. 8, the digitally modulated signal 301 modulated by the OFDM method is characterized by having a PAR larger than those of modulated signals modulated by the other modulation methods. Referring to FIG. 1, the input signal, that is, for example, the digitally modulated signal 301 subjected to OFDM modulation according to transmission data, is inputted to the signal calculating unit 121 and the control unit 111 via the directional coupler 151.

Furthermore, the signal calculating unit 121 performs a vector resolution to divide the inputted modulated signal into a plurality of N constant amplitude signals having a substantially identical predetermined constant amplitude value and predetermined phases different from each other based on phase control signals indicating the phases of the respective constant amplitude signals from the vector phase and vector amplitude value calculating circuit 116 of the control circuit 111, and a constant amplitude value control signal indicating the amplitude value of the respective constant amplitude signals, and outputs the N constant amplitude signals to the respective N power amplifiers 131-$n$.

Moreover, each of the N power amplifiers 131-$n$ amplifies an electric power of the inputted constant amplitude signal under substantially the same operating conditions, and outputs the power-amplified constant amplitude signal to the power combiner 141. In this case, the predetermined operating conditions are power supply voltages of the respective M stages of amplifiers 132-$m$ constituting each of the N power amplifiers 131-$n$ and bias points that are operating points of the respective M stages of amplifiers 132-$m$. Each of the M stages of amplifiers 132-$m$ is controlled for every predetermined unit time interval so as to operate near a maximum efficient point based on the power supply voltages from the voltage control circuit 118 of the control circuit 111 and a bias point adjustment voltage from the bias point adjustment voltage supply circuit 117. In this case, the bias point adjustment voltage supply circuit 117 applies a bias point adjustment voltage to each of the amplifiers 132-$m$, and this leads to supply of a predetermined bias current to each of the amplifiers 132-$m$. The operations performed by the M stages of amplifiers 132-$m$ will be described later in detail. Moreover, the power combiner 141 combines electric powers of the inputted power-amplified constant amplitude signals, generates a power-amplified modulated signal, and outputs the power-amplified modulated signal.

Figure 4:
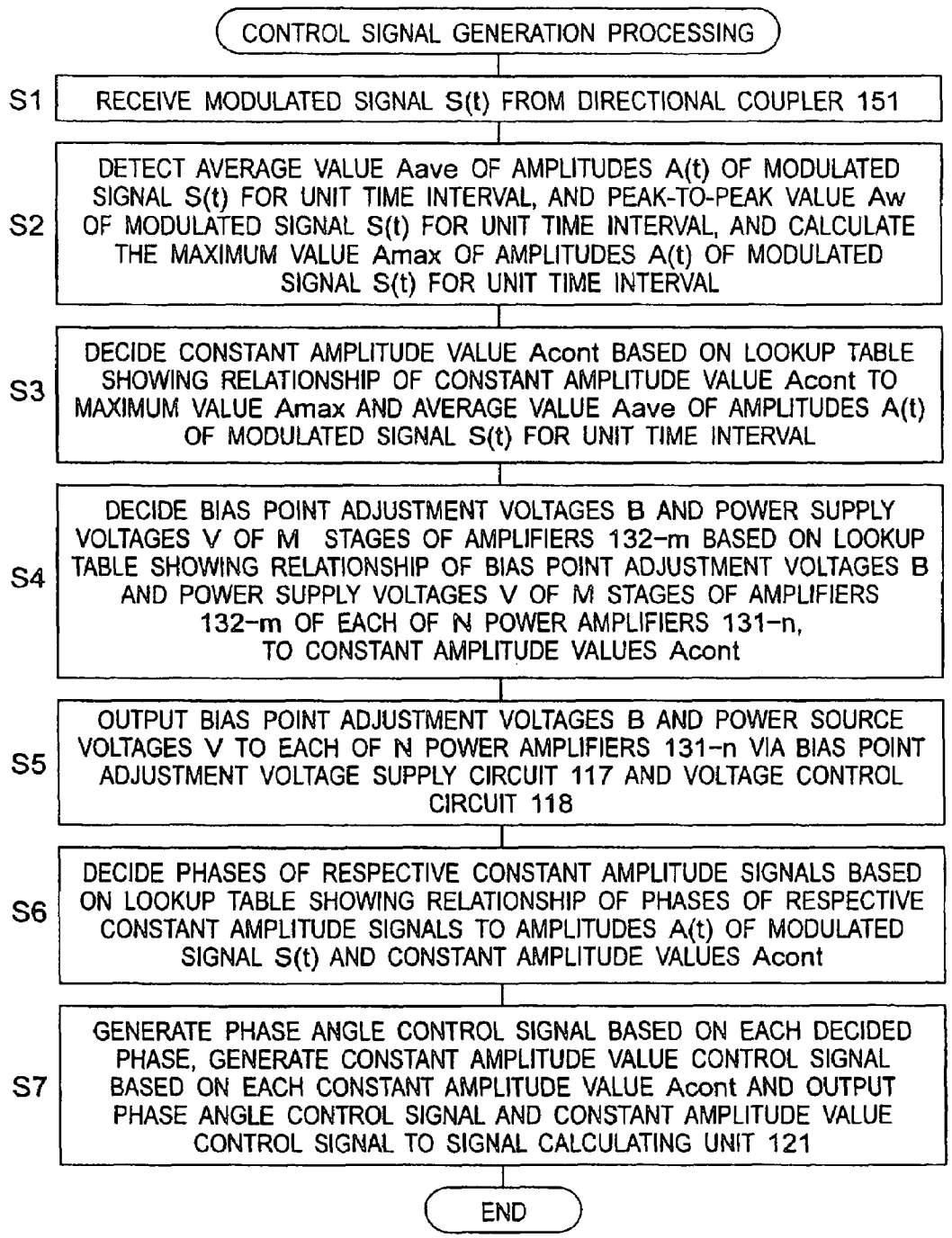
FIG. 4 is a flowchart showing a control signal generation processing executed by the control circuit 111 shown in FIG. 2.

FIG. 4 is a flowchart showing a control signal generation processing executed by the control circuit 111 shown in FIG. 2. FIG. 5A shows an example of a lookup table showing the relationship of constant amplitude value Acont to the maximum value Amax and average value Aave of amplitude A(t) of the modulated signal S(t) for the unit time interval. The lookup table shown in FIG. 5A is referred to at step S3 shown in FIG. 4. FIG. 5B shows an example of a lookup table showing the relationship of a phase difference φ between two constant amplitude signals to the amplitudes A(t) and constant amplitude values Acont of the modulated signal S(t) if N is 2 (N=2). The lookup table shown in FIG. 5B is referred to at step S6 shown in FIG. 4. FIG. 5C shows an example of a lookup table showing the relationship of bias point adjustment voltages B and power supply voltages V of the M stages of amplifiers 132-$m$ within each of the N power amplifiers 131-$n$, to the constant amplitude values Acont. The lookup table shown in FIG. 5C is referred to at step S4 shown in FIG. 4. Each of the lookup tables shown in FIGS. 5A, 5B, and 5C is created by a method to be described later, and stored in the table memory 110 shown in FIG. 2 in advance.

The methods of creating the lookup tables shown in FIGS. 5A and 5B will be specifically described with reference to such cases that the signal calculating unit 121 shown in FIG. 1 divides the modulated signal into two, three, or four signals, respectively.

Figure 6A:
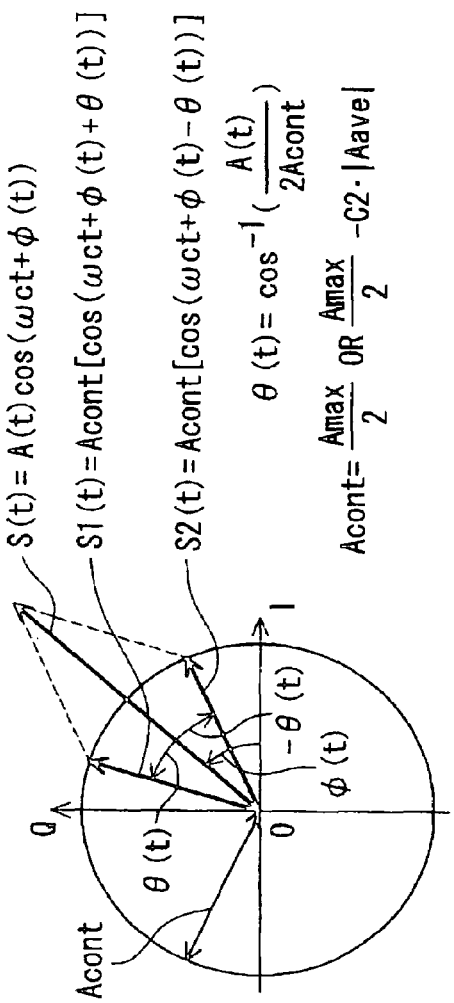
FIG. 6A is a vector diagram showing that a signal calculating unit 121 shown in FIG. 1 divides the modulated signal S(t) into two constant amplitude signals S1($t$) and S2($t$)

FIG. 6A is a vector diagram showing that the signal calculating unit 121 shown in FIG. 1 divides the modulated signal S(t) into two constant amplitude signals S1(t) and S2(t). Referring to FIG. 6A, the modulated signal S(t) is represented by the following Equation (5):

$$S(t)=A(t)\cos(\omega_c t+\phi(t)) \quad (5),$$

where A(t) denotes an amplitude of the modulated signal S(t), 6 cc denotes a carrier frequency of the modulated signal S(t), and φ(t) denotes a phase of the modulated signal S(t). In this case, the constant amplitude signals S1(t) and S2(t) include the constant amplitude value Acont, and are represented by the following Equations (6) and (7), respectively as shown in FIG. 6A:

$$S1(t)=A cont[\cos(\omega_c t+\phi(t)+\theta(t))] \quad (6), \text{ and}$$

$$S2(t)=A cont[\cos(\omega_c t+\phi(t)-\theta(t))] \quad (7).$$

In this case, a phase difference between the modulated signal S(t) and each of the constant amplitude signals S1(t) and S2(t) is θ(t), a phase difference between the constant amplitude signals S1(t) and S2(t) is 2θ(t), and the phase difference θ(t) is represented by the following Equation (8):

$$\theta(t) = \cos^{-1}\left(\frac{A(t)}{2Acont}\right). \quad (8)$$

In this case, the constant amplitude value Acont for a unit time interval is decided so as to suppress a combined loss generated in the power combiner 141 based on the maximum value Amax and average value Aave of the amplitude of the modulated signal S(t) for the unit time interval as follows:

(A) If the average value Aave of the amplitude of the modulated signal S(t) for the unit time interval is equal to or greater than Amax/2, Acont=Amax/2.

(B) If the average value Aave of the amplitude of the modulated signal S(t) for the unit time interval is smaller than Amax/2, then the phase difference between the constant amplitude signals S1(t) and S2(t) becomes large, and the combined loss increases in the power combiner 141 (See, for example, FIG. 24B). Due to this, the constant amplitude value Acont is set smaller than Amax/2 so that an error rate or the like resulting from nonlinearity and allowed in an overall system has a value in a predetermined range according to a magnitude of the average value Aave. It is assumed in the present preferred embodiment that, when Aave<Amax/2, Acont=Amax/2−C2·|Aave|. In this case, C2 is assumed to be a predetermined constant satisfying a relationship of 0<C2<Amax/(2|Aave|).

Furthermore, the phase difference θ(t) between the modulated signal S(t) and each of the constant amplitude signal S1(t) and S2(t) is calculated using the Equation (8) based on the decided constant amplitude value Acont and the amplitude value A(t) of the modulated signal S(t). In addition, respective phases φ(t)+θ(t) and φ(t)−θ(t) of the constant amplitude signals S1(t) and S2(t) different from each other are calculated. Then it is possible to calculate the respective phases φ(t)+θ(t) and φ(t)−θ(t) of the constant amplitude signals S1(t) and S2(t) so as to divide the modulated signal S(t) into the two constant amplitude signals S1(t) and S2(t) having the decided constant amplitude value Acont and the different phases φ(t)+θ(t) and φ(t)−θ(t), respectively.

The maximum value Amax and the average value Aave of the amplitude A(t) of the modulated signal S(t) for every unit time interval are changed based on the above-stated method of deciding the constant amplitude value Acont to, for example, Amax1, Amax2, . . . , and AmaxI and Aave1, Aave2, . . . , and AaveJ are calculated. Further, constant amplitude values Acontij relative to the maximum values Amaxi (where i=1, 2, . . . , I) and the average values Aavej (where j=1, 2, . . . , J), respectively are calculated. Then the lookup table shown in FIG. 5A and showing the relationship of the constant value Acont to the maximum value Amax and the average value Aave of the amplitude A(t) of the modulated signal S(t) is created and stored in the table memory 119 in advance.

Moreover, the phase differences φkl (where k=1, 2, . . . , k; and l=1, 2, . . . , L) between the constant amplitude signals S1(t) and S2(t) for the respective constant amplitude values Acont1, Acont2, . . . , and AcontL and the respective amplitudes A1, A2, . . . , and AK of the modulated signals S(t) are calculated using the Equation (8) based on the above-state method of calculating the phase difference between the constant amplitude signals S1(t) and S2(t). Further, the lookup table shown in FIG. 5B and showing the relationship of the two constant amplitude signals S1(t) and S2(t) to the amplitude A(t) of the modulated signal S(t) and the constant amplitude Acont is created based on the respective calculated phase differences φkl, and stored in the table memory 119 in advance.

When the signal calculating unit 121 shown in FIG. 1 divides the modulated signal into three or more constant amplitude signals, available vector resolution methods are innumerable. In the present preferred embodiment, the amplitude value of the constant amplitude signal and the phases of the respective constant amplitude signals are decided so as to obtain symmetric constant amplitude signal vectors about a modulated signal vector.

Figure 6B:
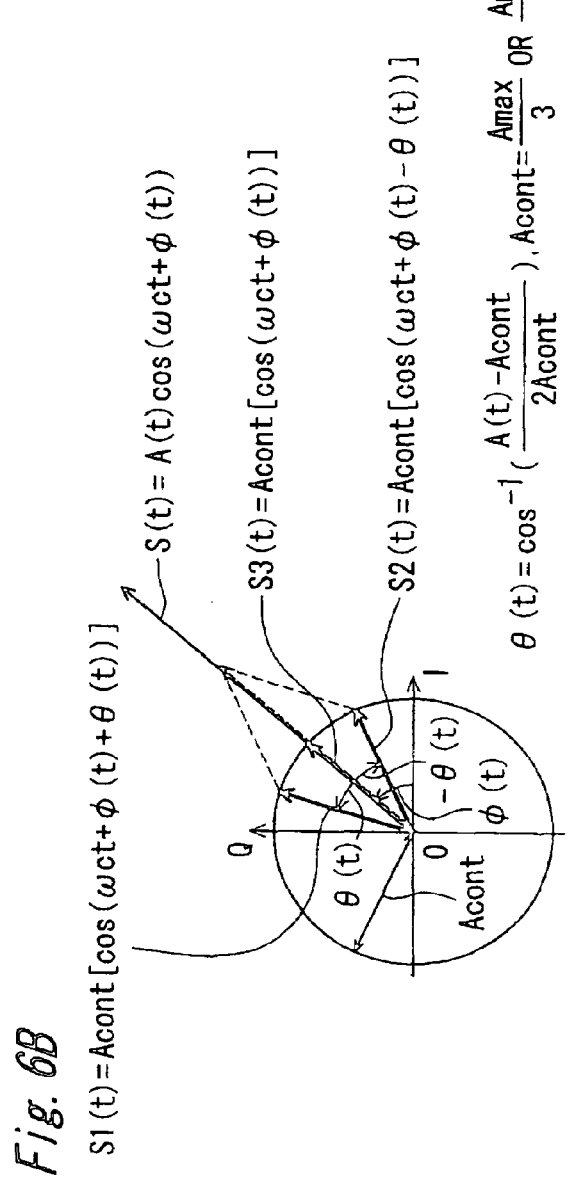
FIG. 6B is a vector diagram showing that the signal calculating unit 121 shown in FIG. 1 divides the modulated signal S(t) represented by the Equation (5) into a constant amplitude signal S3($t$) having an identical phase φ(t) to that of the modulated signal S(t) and two constant amplitude signals S1($t$) and S2($t$) symmetric about the constant amplitude signal S3($t$)

FIG. 6B is a vector diagram showing that the signal calculating unit 121 shown in FIG. 1 divides the modulated signal S(t) represented by the Equation (5) into a constant amplitude signal S3(t) having an identical phase φ(t) to that of the modulated signal S(t) and two constant amplitude signals S1(t) and S2(t) symmetric about the constant amplitude signal S3(t). Referring to FIG. 6B, the constant amplitude signals S1(t), S2(t), and S3(t) have the constant amplitude value Acont and are represented by the following Equations (9), (10), and (11), respectively:

$$S1(t)=A cont[\cos(\omega_c t+\phi(t)+\theta(t))] \quad (9),$$

$$S2(t)=A cont[\cos(\omega_c t+\phi(t)-\theta(t))] \quad (10), \text{ and}$$

$$S3(t)=A cont[\cos(\omega_c t+\phi(t))] \quad (11).$$

In this case, the phase differences between the modulated signal S(t) or the constant amplitude signal S(3) and the constant amplitude signals S1(t) and S2(t) are θ(t), respectively. The phase difference between the constant amplitude signals S1(t) and S2(t) is 2θ(t) and the phase difference θ(t) is represented by the following Equation (12):

$$\theta(t) = \cos^{-1}\left(\frac{A(t) - Acont}{2Acont}\right). \quad (12)$$

In this case, the constant amplitude value Acont for a unit time interval is decided as follows so as to suppress a combined loss generated in the power combiner 141 based on the maximum value Amax and the average value Aave of the amplitude of the modulated signal S(t) for the unit time interval.

(A) If the average value Aave of the amplitude of the modulated signal S(t) for the unit time interval is equal to or greater than Amax/3, Acont=Amax/3.

(B) If the average value Aave of the amplitude of the modulated signal S(t) for the unit time interval is smaller than Amax/3, then the phase differences among the constant amplitude signals $S1(t)$, $S2(t)$, and $S3(t)$ become large, and the combined loss increases in the power combiner 141. Due to this, the constant amplitude value Acont is set smaller than Amax/3 so that the error rate or the like resulting from nonlinearity and allowed in the overall system has a value in a predetermined range according to the magnitude of the average value Aave. It is assumed in the present preferred embodiment that, when Aave<Amax/3, Acont=Amax/3−C3·|Aave|. In this case, C3 is assumed to be a predetermined constant satisfying a relationship of 0<C3<Amax/(3|Aave|).

Furthermore, the phase difference θ(t) between the modulated signal S(t) and each of the constant amplitude signal $S1(t)$ and $S2(t)$ is calculated using the Equation (12) based on the decided constant amplitude value Acont and the amplitude value A(t) of the modulated signal S(t). In addition, phases φ(t)+θ(t) and φ(t)−θ(t) of the constant amplitude signals $S1(t)$ and $S2(t)$ different from each other are calculated, respectively. Then it is possible to calculate the respective phases φ(t)+θ(t), φ(t)−θ(t), and φ(t) of the constant amplitude signals $S1(t)$, $S2(t)$, and $S3(t)$ so as to divide the modulated signal S(t) into the three constant amplitude signals $S1(t)$, $S2(t)$, and $S3(t)$ having the decided constant amplitude value Acont and the different phases φ(t)+θ(t), φ(t)−θ(t), and φ(t), respectively.

A lookup table showing the relationship of the constant value Acont to the maximum value Amax and the average value Aave of the amplitude A(t) of the modulated signal S(t) is created based on the above-stated method of deciding the constant amplitude value Acont in a manner similar to that of the resolution of the modulated signal S(t) into the two constant amplitude signals $S1(t)$ and $S2(t)$, and stored in the table memory 119 in advance. Moreover, a lookup table showing the relationship of the phases of the three constant amplitude signals $S1(t)$, $S2(t)$, and $S3(t)$ to the amplitude A(t) of the modulated signal S(t) and the constant amplitude value Acont is created based on the above-stated method of calculating the respective phases of the constant amplitude signals $S1(t)$, $S2(t)$, and $S3(t)$ in a manner similar to that of the resolution of the modulated signal S(t) into the two constant amplitude signals $S1(t)$ and $S2(t)$, and stored in the table memory 119 in advance.

Figure 7:
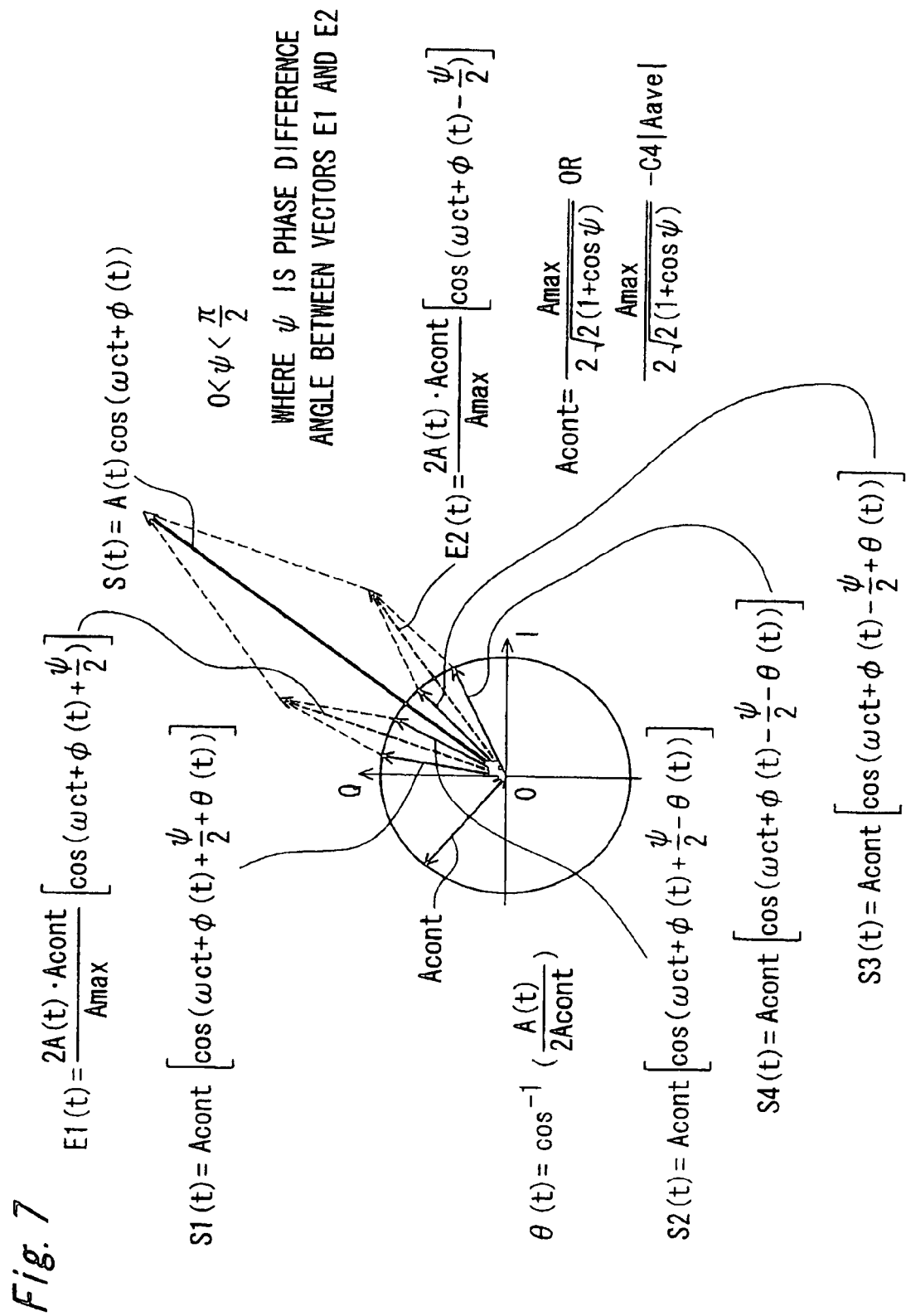
FIG. 7 is a vector diagram showing that the signal calculating unit 121 shown in FIG. 1 divides the modulated signal S(t) represented by the Equation (5) into four constant amplitude signals S1($t$) to S4($t$)

FIG. 7 is a vector diagram showing that the signal calculating unit 121 shown in FIG. 1 divides the modulated signal S(t) represented by the Equation (5) into four constant amplitude signals $S1(t)$ to $S4(t)$. Referring to FIG. 7, the modulated signal S(t) represented by the Equation (5) is divided into two signals $E1(t)$ and $E2(t)$ symmetric about the modulated signal S(t) and having a phase difference ψ between them. Thereafter, the signal $E1(t)$ is divided into two constant amplitude signals $S1(t)$ and $S2(t)$ symmetric about the signal $E1(t)$, and the signal $E2(t)$ is divided into two constant amplitude signals $S3(t)$ and $S4(t)$ symmetric about the signal $E2(t)$. Then the four constant amplitude signals $S1(t)$ to $S4(t)$ are obtained. In this case, the phase difference ψ between the signals $E1(t)$ and $E2(t)$ is a predetermined value that satisfies the following Equation (11):

$$0 < \psi < \frac{\pi}{2}. \tag{13}$$

The constant amplitude signals $S1(t)$, $S2(t)$, $S3(t)$, and $S4(t)$ have the constant amplitude value Acont and are represented by the following Equations (14), (15), (16), and (17), respectively as shown in FIG. 7:

$$S1(t) = Acont\left[\cos\left(\omega_c t + \phi(t) + \frac{\psi}{2} + \theta(t)\right)\right], \tag{14}$$

$$S2(t) = Acont\left[\cos\left(\omega_c t + \phi(t) + \frac{\psi}{2} - \theta(t)\right)\right], \tag{15}$$

$$S3(t) = Acont\left[\cos\left(\omega_c t + \phi(t) - \frac{\psi}{2} + \theta(t)\right)\right], \tag{16}$$

and $$S4(t) = Acont\left[\cos\left(\omega_c t + \phi(t) - \frac{\psi}{2} - \theta(t)\right)\right], \tag{17}$$

where the phase difference between the signal $E1(t)$ and each of the constant amplitude signals $S1(t)$ and $S2(t)$ and that between the signal $E2(t)$ and each of the constant amplitude signals $S3(t)$ and $S4(t)$ are θ(t), respectively. The phase difference θ(t) satisfies the following Equation (18):

$$\theta(t) = \cos^{-1}\left(\frac{A(t)}{2Acont}\right). \tag{18}$$

In this case, the constant amplitude value Acont for a unit time interval is decided as follows so as to suppress a combined loss generated in the power combiner 141 based on the maximum value Amax and the average value Aave of the amplitude of the modulated signal S(t) for the unit time interval.

(A) If the average value Aave of the amplitude of the modulated signal for the unit time interval is equal to or grater than Amax/4, the constant amplitude value Acont is a value represented by the following Equation (19):

$$Acont = \frac{Amax}{2\sqrt{2(1+\cos\psi)}}. \tag{19}$$

(B) If the average value Aave of the amplitude of the modulated signal for the unit time interval is smaller than Amax/4, then the phase differences among the constant amplitude signals $S1(t)$ to $S4(t)$ become large, and the combined loss increases in the power combiner 141. Due to this, the constant amplitude value Acont is set smaller than the value represented by the Equation (19) so that the error rate or the like resulting from nonlinearity and allowed in the overall system has a value in a predetermined range according to the magnitude of the average value Aave. It is assumed in the present preferred embodiment that, when Aave<Amax/4, the constant amplitude value Acont is a value represented by the following Equation (20):

$$A_{cont} = \frac{A\max}{2\sqrt{2(1+\cos\psi)}} - C4 \times |A_{ave}|, \quad (20)$$

where C4 is a constant that satisfies the following Equation (21):

$$0 < C4 < \frac{A\max}{2|A_{ave}|\sqrt{2(1+\cos\psi)}}. \quad (21)$$

Furthermore, the phase difference θ(t) between the signal E1(t) and each of the constant amplitude signals S1(t) and S2(t) and that between the signal E2(t) and each of the constant amplitude signals S3(t) and S4(t) are calculated based on the decided constant amplitude value Acont and the amplitude value A(t) of the modulated signal S(t) using the Equation (18). Further, phases φ(t)+ψ/2+θ(t), φ(t)+ψ/2−θ(t), φ(t)−ψ/2+θ(t), and φ(t)−ψ/2−θ(t) of the constant amplitude signals S1(t), S2(t), S3(t), and S4(t) different from each other are calculated, respectively. Then it is possible to calculate the respective phases φ(t)+ψ/2+θ(t), φ(t)+ψ/2−θ(t), φ(t)−ψ/2+θ(t), and φ(t)−ψ/2−θ(t) of the constant amplitude signals S1(t), S2(t), S3(t), and S4(t) so as to divide the modulated signal S(t) into the four constant amplitude signals S1(t), S2(t), S3(t), and S4(t) having the decided constant amplitude value Acont and the different phases φ(t)+ψ/2+θ(t), θ(t)+ψ/2−θ(t), φ(t)−ψ/2+θ(t), and φ(t)−ψ/2−θ(t), respectively.

A lookup table showing the relationship of the constant value Acont to the maximum value Amax and the average value Aave of the amplitude A(t) of the modulated signal S(t) is created based on the above-stated method of deciding the constant amplitude value Acont in a manner similar to that of the resolution of the modulated signal S(t) into the two constant amplitude signals S1(t) and S2(t), and stored in the table memory 119 in advance. Moreover, a lookup table showing the relationship of the phases of the four constant amplitude signals S1(t), S2(t), S3(t), and S4(t) to the amplitude A(t) of the modulated signal S(t) and the constant amplitude value Acont is created based on the above-stated method of calculating the respective phases of the constant amplitude signals S1(t), S2(t), S3(t), and S4(t) in a manner similar to that of the resolution of the modulated signal S(t) into the two constant amplitude signals S1(t) and S2(t), and stored in the table memory 119 in advance.

Likewise, the constant amplitude signal may be divided into five or more odd or even-numbered constant amplitude signals. In this case, constant amplitude signal can be divided into N constant amplitude signals by performing the vector resolution (N−1) times. By dividing the modulated signal into more constant amplitude signals, it is possible to further reduce a handling power per constant amplitude signal and lessen the load of peripherals for processing each constant amplitude signal, which enables the present preferred embodiment of the present invention to be conveniently applied to an integrated circuit.

In this case, when the modulated signal is divided into N constant amplitude signals equal in constant amplitude value and having different phases, it is preferable to set the constant amplitude value to about 1/N of the maximum amplitude value Amax of the modulated signal for the unit time interval. However, when the average value Aave of the amplitude of the modulated signal for the unit time interval is smaller than Amax/N, then the phase differences among the constant amplitude signals grow and the combined loss increases in the power combiner 141. Due to this, the constant amplitude value Acont is set smaller than Amax/N so that the error rate or the like resulting from nonlinearity and allowed in the overall system has a value in a predetermined range according to the magnitude of the average value Aave, and this leads to suppression of the combined loss generated in the power combiner 141.

The lookup table (See FIG. 5A) showing the relationship of the constant amplitude value Acont to the maximum value Amax and the average value Aave of the amplitude A(t) of the modulated signal S(t) for a unit time interval is created in advance based on the above-stated method of calculating the constant amplitude value Acont, and stored in the table memory 119. Further, the phases of the respective constant amplitude signals are decided based on the amplitude value Acont of the constant amplitude signals, and a lookup table showing the relationship of the respective phases to the amplitude A(t) of the modulated signal S(t) and the constant amplitude value Acont is created in advance and stored in the table memory 11. As stated so far, according to the present preferred embodiment, the amplitude value of the constant amplitude signals is decided so as to suppress the combined loss generated in the power combiner 141 based on the amplitude average value and the maximum value of the modulated signal for the unit time interval. Therefore, the power of the modulated signal can be amplified with high efficiency substantially linearly.

Figure 11:
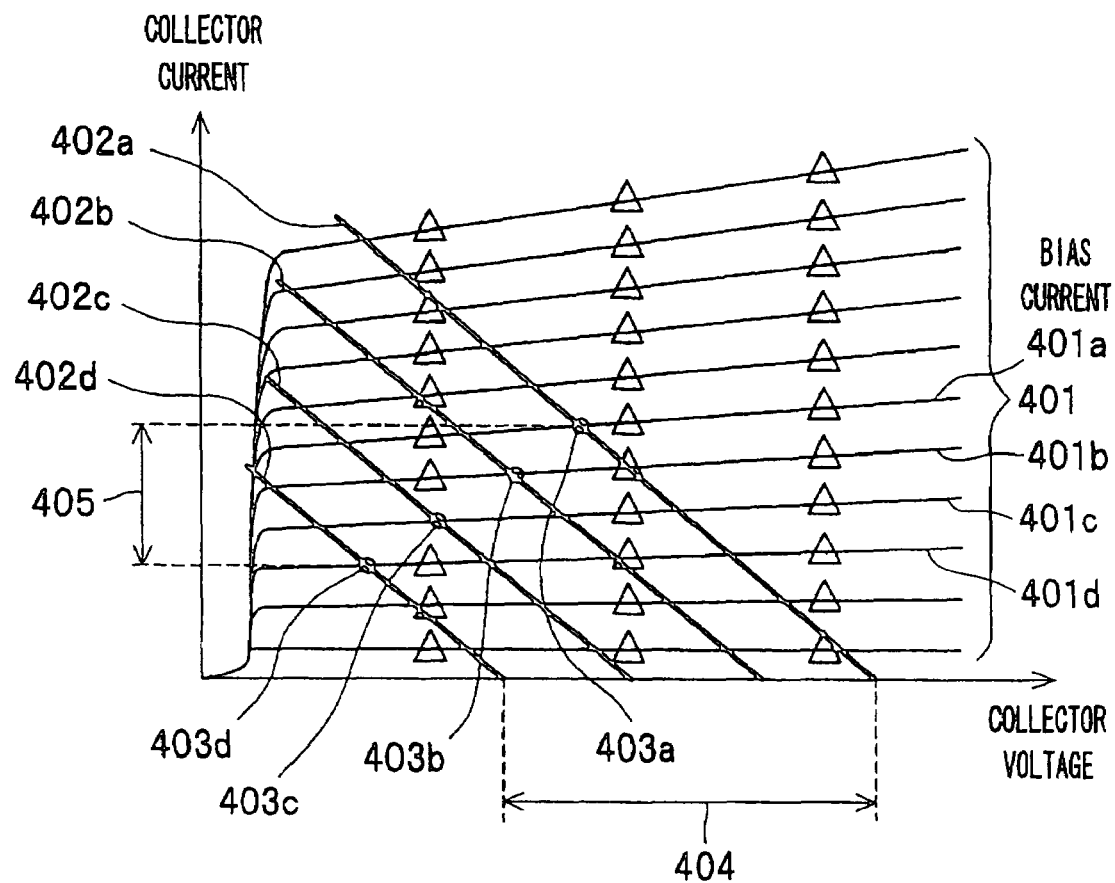
FIG. 11 is a graph showing examples of changes of load lines 402$a$ to 402$d$ due to collector current to collector voltage characteristic curves 401 and changes of bias points in the emitter-grounded transistor power amplifier circuits that is each of the amplifiers 132-$m$ shown in FIG. 3.

Referring next to FIGS. 11 and 12, the method of creating the lookup table shown in FIG. 5C and the operations performed by a plurality of M stages of amplifiers 132-m of each of a plurality of N power amplifiers 131-n will be described. FIG. 11 is a graph showing an example of changes of load lines 402a to 402d due to collector current-collector voltage characteristic curves 401 of emitter-grounded transistor power amplifier circuits that are the respective amplifiers 132-m shown in FIG. 3, and changes of bias points in the emitter-grounded transistor power amplifier circuits. In case of high frequency amplification operation, a load line is generally elliptical because a load contains a reactance component. However, for helping understand, the load is assumed to contain a pure resistance component and the load lines 402a to 402d are assumed to be straight lines. Furthermore, an amplitude central point of the amplification operation is normally present at an arbitrary location on the load lines 402a to 402d depending on an operation degree of the amplification operation. For helping understand, it is assumed that the amplitude central point is present near the center of the load lines 402a to 402d. FIG. 12 is a graph showing an example of changes of input and output characteristics of the power amplifier due to changes of at least one of a bias current and a power supply voltage of an emitter-grounded transistor power amplifier circuit that is each of the amplifiers 132-m shown in FIG. 3, that is, changes of a bias point.

Figure 12A:
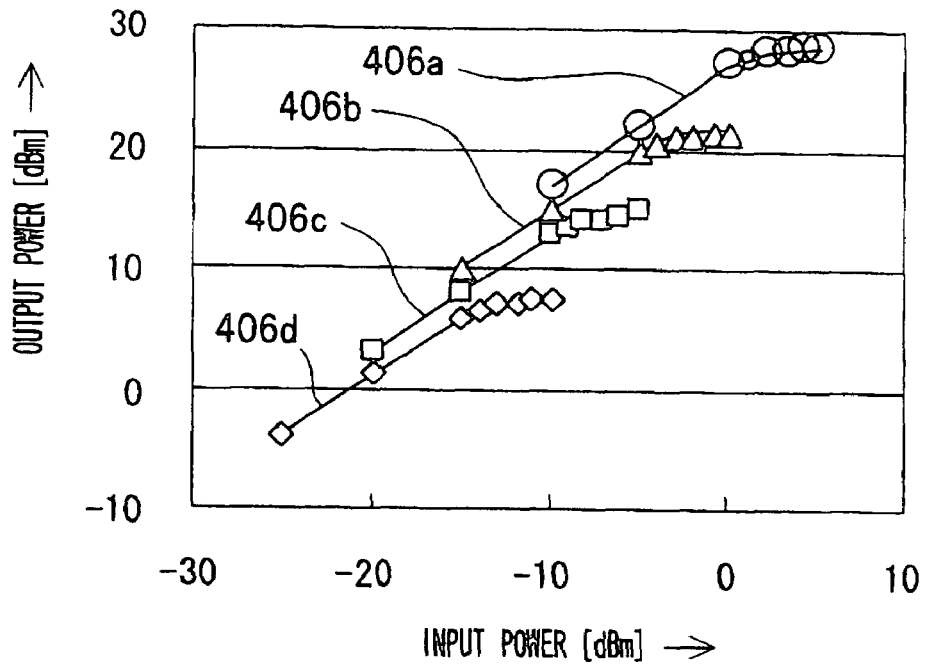
FIG. 12 is a graph showing examples of changes of input and output characteristics of the power amplifier due to changes of bias point in the emitter-grounded transistor power amplifier circuit that is each of the amplifiers 132-$m$ shown in FIG. 3.
Figure 12B:
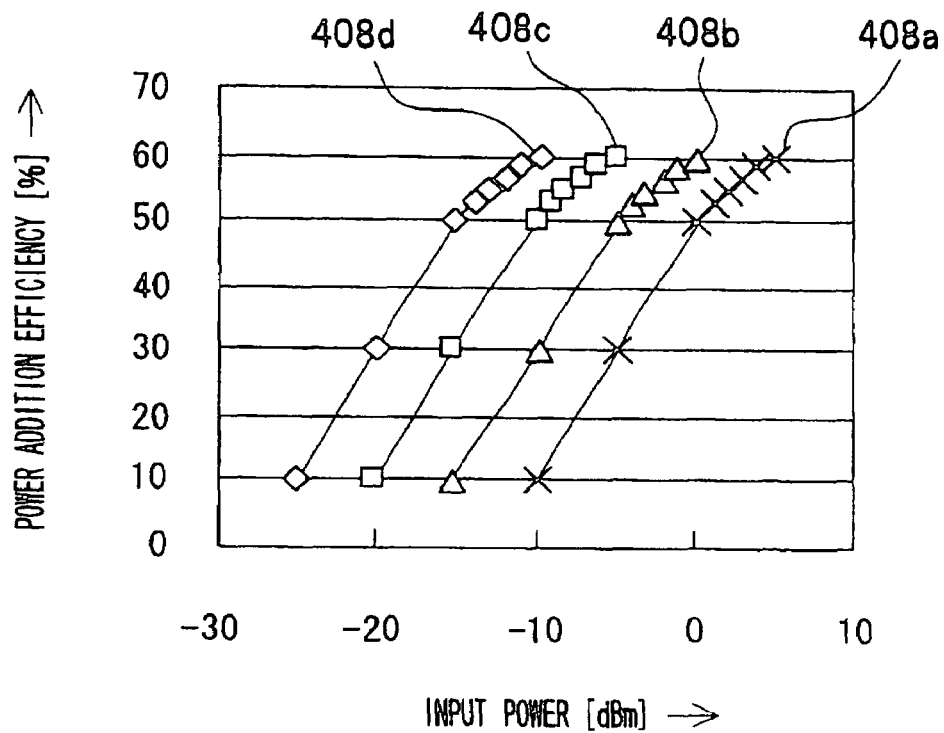

In the amplifiers 132-m that are the emitter-grounded transistor power amplifier circuits, changing a collector voltage that is a power supply voltage in a voltage range 404 shown in FIG. 11 or changing a bias current that is a base current in a current range 405 shown in FIG. 11 corresponds to sliding the load lines 402a to 402d or the bias points 403a to 403d on the collector current-collector voltage characteristic curves 401 according to their changes, respectively. For example, when the power supply voltage or the bias current is reduced, the respective load lines 402a to 402d become gradually shorter. At this time, as shown in FIGS. 12A and 12B, output powers of the amplifiers 132-m exhibit input and output characteristics 406a to 406d that saturated outputs gradually lower according to the changes in the load lines 402a to 402d, respectively. Moreover, power addition efficiencies of the amplifiers 132-m exhibit characteristics 408a to 408d that the efficiencies are always at maximum near saturation points of the respective input and output characteristics 406a to 406d. Namely, to make output powers variable while keeping the power addition efficiencies high in the amplifiers 132-m, it suffices to control the bias points of the power amplifiers 132-m to be always kept in amplification operation ranges near the respective saturation points. Therefore, in the present preferred embodiment, a power supply voltage and a bias current with which a plurality of M stages of amplifiers 132-m operate near their respective maximum efficiency points is decided according to the amplitude value Acont of the constant amplitude signals corresponding to the powers input to the N power amplifiers 131-n. The lookup table (See FIG. 5C) showing a relationship of a bias point adjustment voltage B and a power supply voltage V of the M stages of amplifiers 132-m of each of the N power amplifiers 131-n, to the constant amplitude value Acont is previously created and stored in the table memory 119.

Referring to FIG. 4, the control signal generation processing performed by the control circuit 111 will be described. In this case, the control circuit 111 performs the control signal generation processing shown in FIG. 4 at intervals of several tens of milliseconds to several hundreds of milliseconds. Referring to FIG. 4, first, the high-frequency amplitude detector circuit 115 receives the modulated signal S(t) from the directional coupler 151 at step S1. At step S2, the high-frequency amplitude detector circuit 115 detects the average value Aave of the amplitude A(t) of the received modulated signal S(t) for a unit time interval and a peak-to-peak value Aw thereof, calculates the maximum value Amax of the amplitude A(t) of the modulated signal S(t) for the unit time interval based on the peak-to-peak value Aw, and outputs the maximum value Amax to the vector phase and vector amplitude value calculating circuit 116. In this case, a length of the unit time interval is, for example, several milliseconds.

Next, at step S3, the vector phase and vector amplitude value calculating circuit 116 decides the constant amplitude value Acont with reference to the lookup table (See FIG. 5A) showing the relationship of the constant amplitude value Acont to the maximum value Amax and the average value Aave of the amplitude A(t) of the modulated signal S(t) for the unit time interval, based on the average value Aave and the maximum value Amax of the amplitude A(t) of the modulated signal S(t) for the unit time interval detected at step S2. The lookup table as referred to at step S3 is created and stored in the table memory 119 in advance as stated above. Therefore, the constant amplitude value Acont of the N constant amplitude signals is decided so as to suppress the combined loss generated in the power combiner 141.

At step S4, the vector phase and vector amplitude value calculating circuit 116 decides a bias point adjustment voltage B and a power supply voltage V of the M stages of amplifiers 132-m with reference to the lookup table (See FIG. 5C) showing the relationship of the bias point adjustment voltage B and power supply voltage V of the M stages of amplifiers 132-m of each of the N power amplifiers 131-n to the constant amplitude value Acont, based on the constant amplitude value Acont decided at step S3. In the present preferred embodiment, a common bias point adjustment voltage and a common power supply voltage to all the amplifiers 132-1 to 132-M of each of all the power amplifiers 131-1 to 131-N are used.

At step S5, the vector phase and vector amplitude value calculating circuit 116 outputs the bias point adjustment voltage B and the power supply voltage V to the M stages of amplifiers 132-m within each of the N power amplifiers 131-n via the bias point adjustment voltage supply circuit 117 and the voltage control circuit 118. The bias point adjustment voltage B and the power supply voltage V are applied to the M stages of amplifiers 132-m within each of the N power amplifiers 131-n, and the M stages of amplifiers 132-m operate accordingly. The lookup table as referred to at step S4 is created and stored in the table memory 119 in advance as stated above. Therefore, the M stages of amplifiers 132-m within each of the N power amplifiers 131-n operate near their respective maximum efficiency points, and the N power amplifiers 131-n operate near their respective maximum efficiency points.

Furthermore, at step S6, the vector phase and vector amplitude value calculating circuit 116 decide the phases of the respective constant amplitude signals with reference to the lookup table (if N=2, See FIG. 5B, for example) showing the relationship of phases of respective constant amplitude signals to amplitude A(t) of modulated signal S(t) and the constant amplitude value Acont, based on the amplitude A(t) of the modulated signal S(t) and the constant amplitude value Acont decided at step S3.

At step S7, the vector phase and vector amplitude value calculating circuit 116 generates a phase control signal based on each of the phases decided at step S6, generates a constant amplitude value control signal based on the constant amplitude value Acont, and outputs a phase control signal and a constant amplitude value control signal to the signal calculating unit 121. The signal calculating unit 121 performs a vector resolution to divide the modulated signal from the directional coupler 151 into the N constant amplitude signals having the substantially identical constant amplitude value Acont decided at step S3 and the different phases decided at step S6, according to the inputted phase control signal and constant amplitude value control signal.

In the present preferred embodiment, the constant amplitude value Acont and the different phases of a plurality of constant amplitude signals are decided in the control signal generation processing shown in FIG. 4 with reference to the lookup tables shown in, for example, FIGS. 5A and 5B. However, the present invention is not limited to this. These values may be sequentially calculated at real time based on the maximum value Amax and the average value Aave of the amplitude value A(t) of the modulated signal S(t). In this case, the scale of the calculating unit 116 is made larger and calculation processing time increases. Therefore, it is necessary to control a calculation processing rate to exceed a modulated signal transmission rate. Moreover, in the present preferred embodiment, the constant amplitude value Acont is decided based on the average value Aave and the maximum value Amax of the amplitude A(t) of the modulated signal S(t) for the unit time interval. However, the present invention is not limited to this. The constant amplitude value Acont may be decided based on the average value Aave and the peak-to-peak value Aw of the amplitude A(t) of the modulated signal S(t) for the unit time interval.

Moreover, in the present preferred embodiment, the bias point adjustment voltage B and the power supply voltage V of the M stages of amplifiers 132-m within each of the N power amplifiers 131-n are decided in the control signal generation processing shown in FIG. 4 with reference to the lookup table shown in, for example, FIG. 5C. However, the present invention is not limited to this. The bias point adjustment voltage B and the power supply voltage V may be decided sequentially at real time by calculation. However, in this case, the scale of the calculating unit is made larger and the calculation processing time increases. Therefore, it is necessary to control the calculation processing rate to exceed the modulated signal transmission rate.

As stated so far, according to the present preferred embodiment, the constant amplitude value Acont is decided so as to suppress the combined loss generated in the power combiner 141 based on the average value Aave and the maximum value Amax of the amplitude A(t) of the modulated signal S(t) for the unit time interval. Further, the bias point of each of the N power amplifiers 131-n for amplifying the power of each of the constant amplitude signals is set to the operating point with high power added efficiency near the saturation point based on the amplitude value of the constant amplitude signal. Therefore, it is possible to realize highly efficient and substantially linear power amplification.

Figure 9:
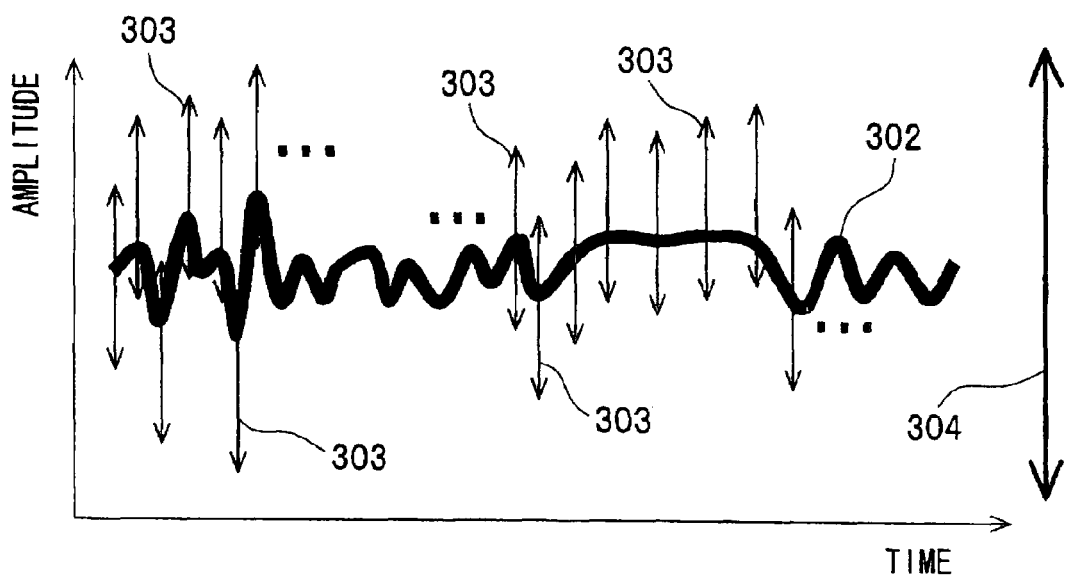
FIG. 9 is a graph showing an example of a peak-to-peak value 303 of the digitally modulated signal 301 shown in FIG. 8 and detected for each of unit time interval.
Figure 10:
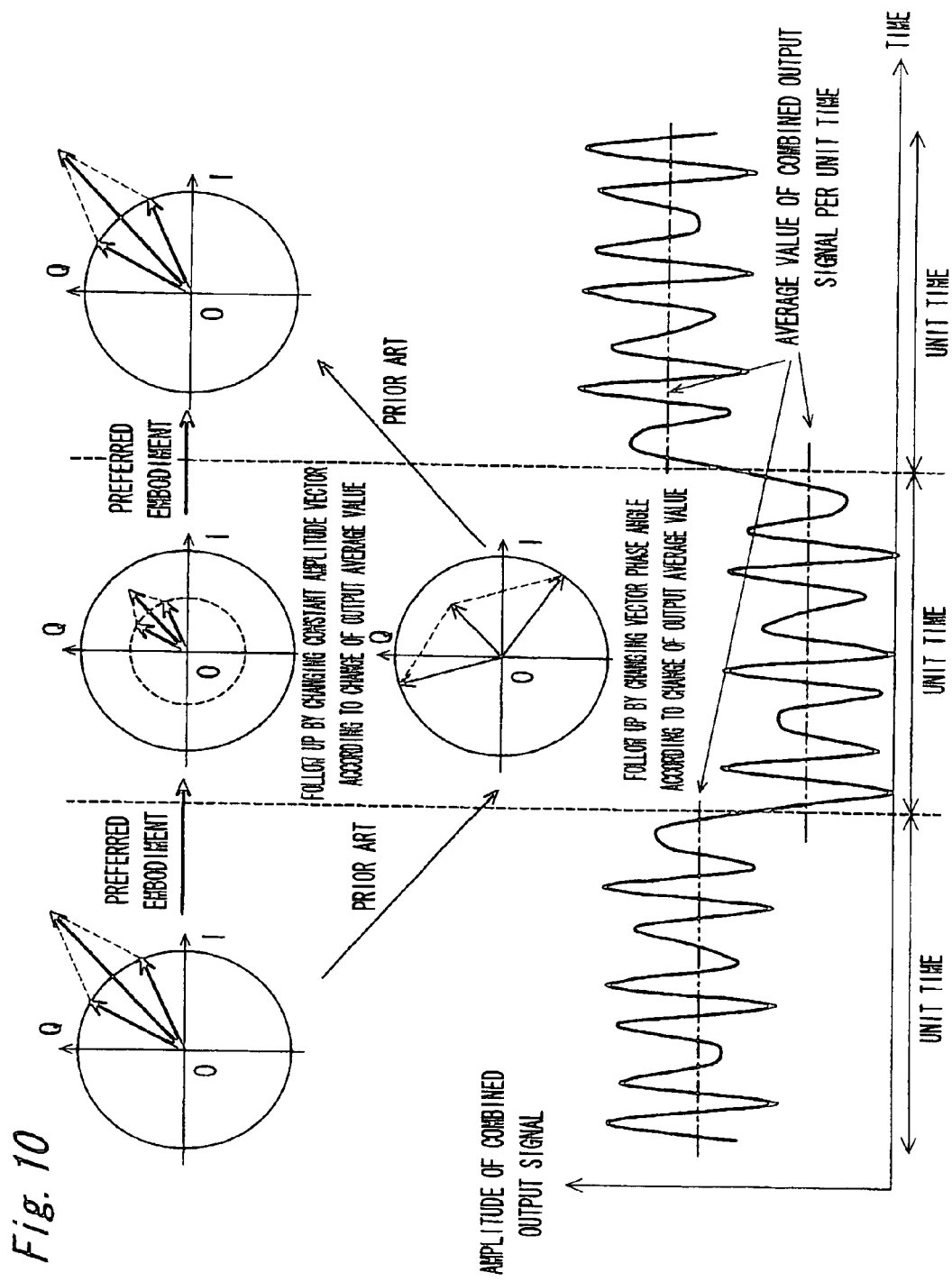
FIG. 10 shows such a case that the digitally modulated signal 301 shown in FIG. 8 is divided into two constant amplitude signals by the signal calculating unit 121 shown in FIG. 1, and such a case that the digitally modulated signal 301 shown in FIG. 8 is divided into two constant amplitude signals by the signal calculating unit 21 of a LINC amplifier 10 according to a prior art shown in FIG. 23.
Figure 23:
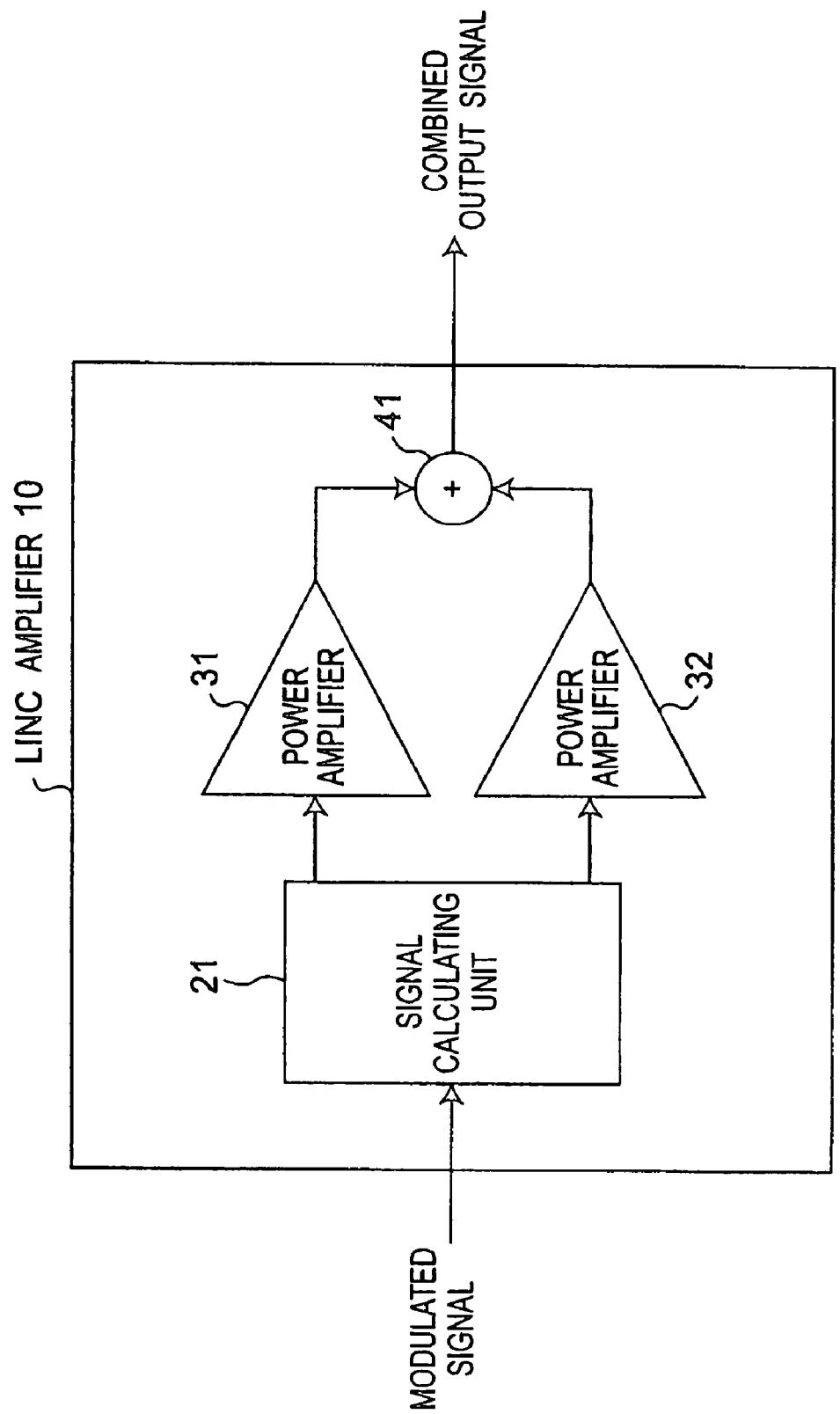
FIG. 23 is a block diagram showing a configuration of a LINC amplifier 10 according to a prior art.

Referring to FIGS. 8 to 10, an example of the operation performed by the transmission power amplifier apparatus 100 according to the present preferred embodiment when the transmission power amplifier apparatus 100 amplifies the power of the digital modulated signal 301 modulated by the OFDM method based on transmission data as shown in FIG. 8 will next be described. FIG. 9 is a graph showing an example of a peak-to-peak value 303 of a digitally modulated signal 301 detected for each of unit time intervals. FIG. 10 shows such a case that the digitally modulated signal 301 shown in FIG. 8 is divided into two constant amplitude signals by the signal calculating unit 121 shown in FIG. 1, and such a case that the digitally modulated signal 301 shown in FIG. 8 is divided into two constant amplitude signals by the signal calculating unit 21 of the LINC amplifier 10 according to the prior art shown in FIG. 23 (these cases are referred to as conventional examples hereinafter). The OFDM method has advantages of high frequency utilization efficiency, capability to easily configure a modulator and demodulator circuit (so-called modem circuit), high resistance against multipath, and the like. However, the amplitude of the modulated signal has a large fluctuation, so that it is difficult to amplify the power of the modulated signal with higher efficiency while keeping linearity according to the prior art.

As shown in FIGS. 8 and 9, the control circuit 111 detects an average value 302 of the amplitude of the digitally modulated signal 301 for a unit time interval, and the peak-to-peak value 303 thereof for the unit time interval. Even if a change width 304 of the amplitude is quite large for entire time intervals of the digitally modulated signal 301, the digitally modulated signal 301 can be regarded as a group of digitally modulated signals 303 each having a relatively small change width of the amplitude on the gently changing average value 302 of the amplitude.

Referring to FIG. 10, an average value of an amplitude of the combined output signal after power combining is smaller for a central time interval than for time intervals before and after the central time interval. Namely, the average value of the amplitude of the digitally modulated signal 301 is smaller for the central time interval. In this case, according to the conventional examples, the digitally modulated signal 301 is divided into the two constant amplitude signals using the same amplitude value for the central time interval as that for the time intervals before and after the central time intervals. Due to this, the phase difference between the two constant amplitude signals is large, and a vector combination loss is generated in the power combiner 141, accordingly. According to the present preferred embodiment, the amplitude value of the constant amplitude signals is decided based on the maximum value and the average value of the amplitude of the digitally modulated signal 301 for each unit time interval. Further, using the smaller amplitude value of the constant amplitude signals for the central time interval shown in FIG. 10 than that for the time interval before and after the central time interval, the phase difference between the constant amplitude signal is kept substantially constant for the entire time intervals. Therefore, even for the time interval for which the average value of the amplitude of the digitally modulated signal 301 is smaller than that for the other time intervals, the vector combination loss is small in the power combiner 141. Besides, the power of each of the constant amplitude signals is amplified by the corresponding power amplifier in conditions of always operating with high efficiency near the saturation point. Therefore, the transmission power amplifier apparatus 100 according to the present preferred embodiment can amplify the power of the digitally modulated signal 301 having a wide dynamic range of the amplitude and modulated by the OFDM method with high efficiency substantially linearly.

However, when the amplitude of the inputted digitally modulated signal 301 changes at high speed, it is impractical to cause the bias points of the calculating unit and the power amplifier calculating the constant amplitude value and phases of the constant amplitude signal, to always follow up the change in the amplitude of the digitally modulated signal 301. This is because a high-speed, very large, and complicated calculating unit and a high-speed, very large, and complicated power supply circuit are required. Namely, phase modulation by combining constant amplitude signal vectors is applied to the amplitude change 303 having the relatively small change width for a unit time interval, and variable control over the amplitude value of the constant amplitude signals and bias control over amplification are applied to the average value of the amplitude or average amplitude value change 302 having the relatively small change width. Then it is possible to realize highly efficient and substantially linear amplification while suppressing generation of the vector combination loss as a whole.

FIG. 13 is a block diagram showing a configuration of a power amplifier 131a-n that is a modified preferred embodiment of the N power amplifiers 131-n shown in FIG. 3. Referring to FIG. 13, the power amplifier 131a-n is configured to include a plurality of M amplifiers 132-m connected in parallel and inputting and amplifying constant amplitude signals from a signal calculating unit 121, respectively, and an adder 133 adding signals from the M amplifiers 132-m and outputting an addition result to a power combiner 141. Each of the amplifiers 132-m is controlled to operate near its maximum efficiency point based on a bias point adjustment voltage and a power supply voltage from a bias point adjustment voltage supply circuit 117 and a voltage control circuit 118.

An arbitrary one of the M stages of amplifiers 132-m that constitute each of the N power amplifiers 131-n may be configured so that a plurality of amplifiers are connected in parallel. Further, because the N power amplifiers 131-n only amplify powers of a plurality of constant amplitude signals, a nonlinear amplifier performing various highly efficient operations can be employed as the N power amplifiers 131-n.

Modified Preferred Embodiment of First Preferred Embodiment

Figure 15:
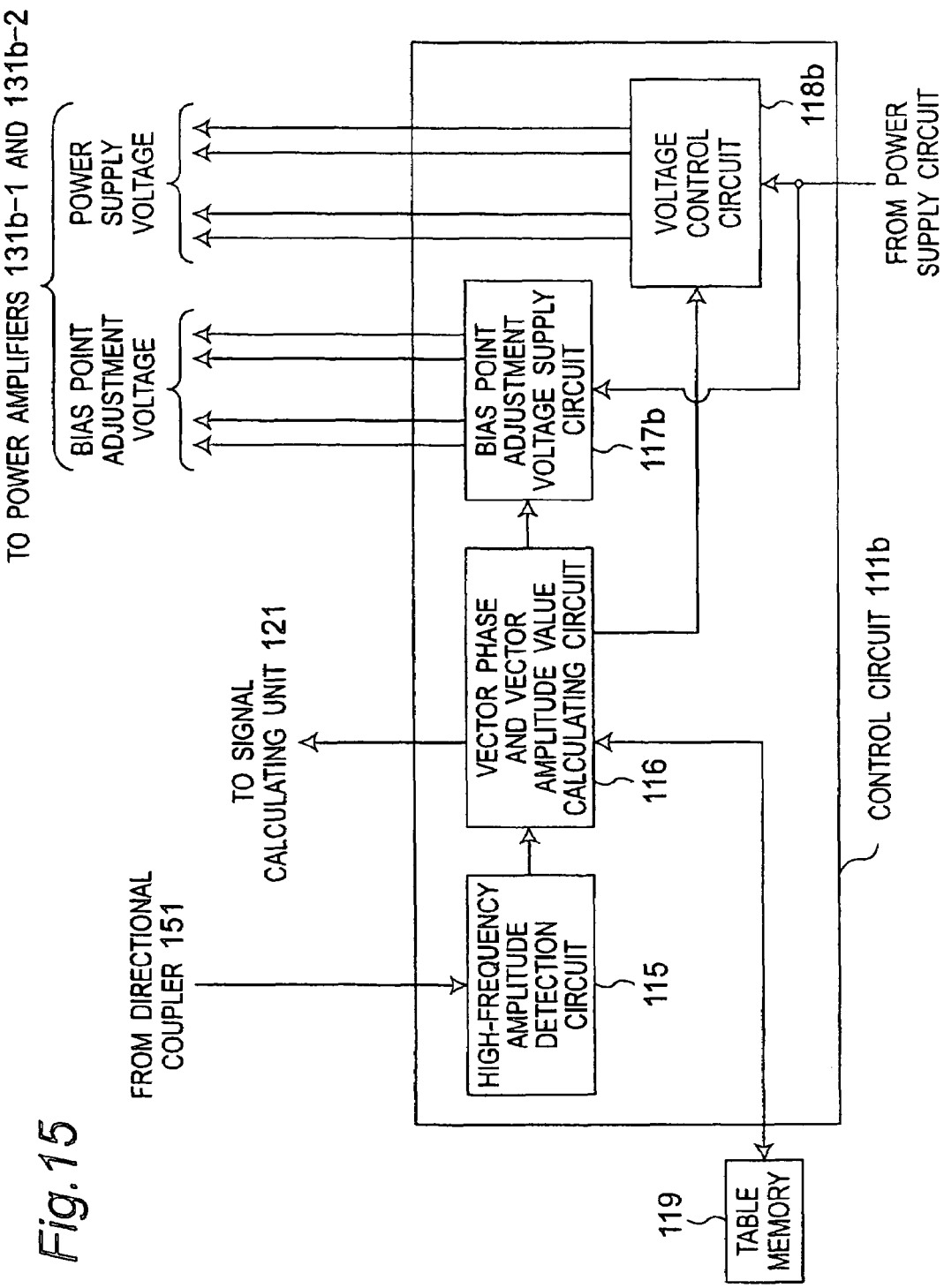
FIG. 15 is a block diagram showing a configuration of a control circuit 111$b$ shown in FIG. 14.
Figure 16:
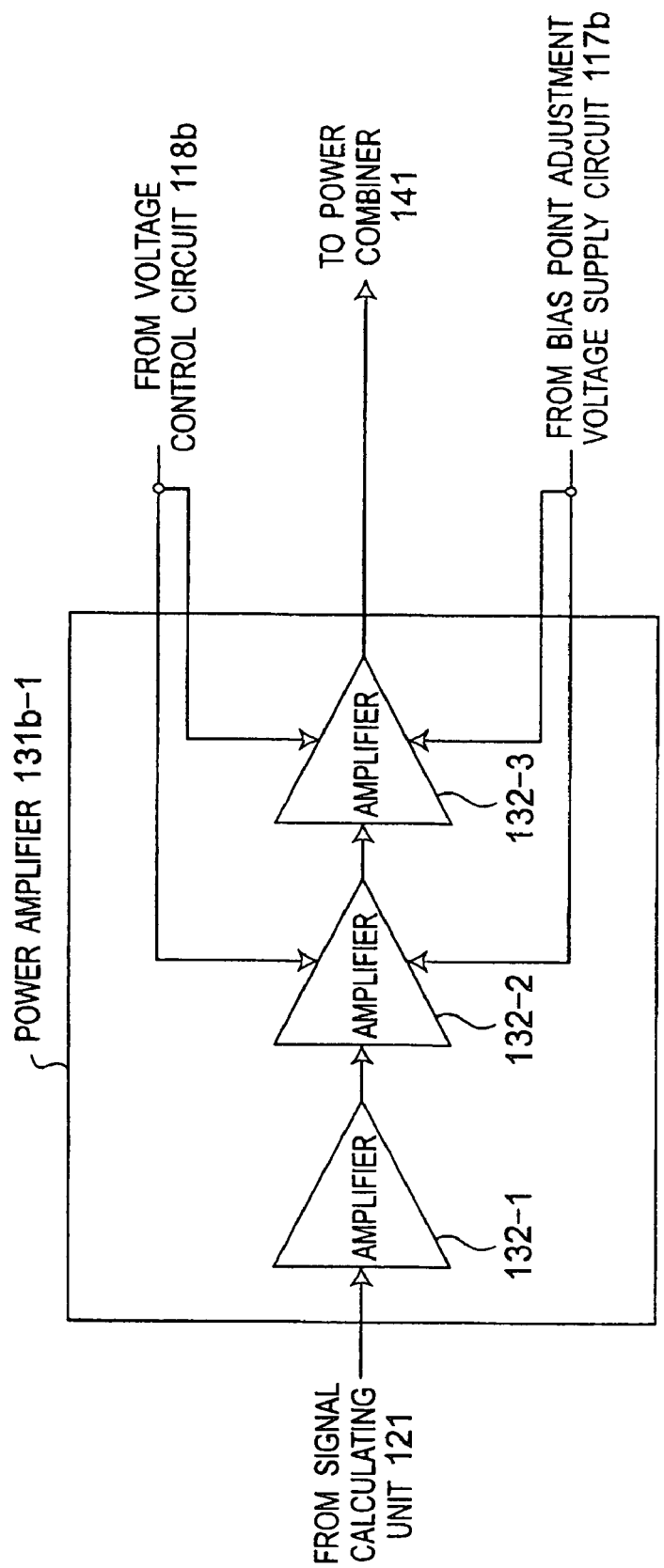
FIG. 16 is a block diagram showing a configuration of power amplifier 131$b$-1 shown in FIG. 13.

FIG. 14 is a block diagram showing a configuration of a transmission power amplifier apparatus 100a according to a modified preferred embodiment of the first preferred embodiment of the present invention. FIG. 15 is a block diagram showing a configuration of a control circuit 111b shown in FIG. 14. FIG. 16 is a block diagram showing a configuration of a power amplifier 131b-1 shown in FIG. 14.

Referring to FIG. 14, the transmission power amplifier apparatus 100a according to the present modified preferred embodiment is characterized, as compared with the transmission power amplifier apparatus 100 according to the first preferred embodiment, by including a control circuit 111b in place of the control circuit 111 and two power amplifiers 131b-1 and 131b-2 in place of the N power amplifiers 131-n. Referring to FIG. 15, the control circuit 111b includes a bias point adjustment voltage supply circuit 117b in place of the bias point adjustment voltage supply circuit 117 and a voltage control circuit 118b in place of the voltage control circuit 118, as compared with the control circuit 111 according to the first preferred embodiment. Referring to FIG. 16, the power amplifier 131b-1 is configured to include three stages of amplifiers 132-1 to 132-3 connected in series. It is to be noted that the power amplifier 131b-2 is equal in configuration to the power amplifier 131b-1. The differences of the modified preferred embodiment from the first preferred embodiment will be described.

Generally speaking, degrees of contributions to power added efficiency of the amplifiers 132-1 to 132-3 constituting the power amplifier 131b-1 are higher in a descending order of stages. In the present modified preferred embodiment, the bias point adjustment voltage supply circuit 117b and the voltage control circuit 118b output a bias point adjustment voltage and a power supply voltage, respectively only to medium and rear stages of amplifiers 132-2 and 132-3 constituting each of the power amplifiers 131b-1 and 131b-2.

Referring to FIG. 15, a signal calculating unit 121 divides an inputted modulated signal into two constant amplitude signals based on a phase control signal indicating a phase difference between the two constant amplitude signals and a constant amplitude value control signal indicating an amplitude value of each of the constant amplitude signals from a vector phase and vector amplitude value calculating unit 116 of the control circuit 111. Further, the signal calculating unit 121 outputs the two constant amplitude signals to the power amplifiers 131b-1 and 131b-2, respectively. The vector phase and vector amplitude value calculating circuit 116 decides a bias point adjustment voltage and a power supply voltage of the medium and rear stage of amplifiers 132-2 and 132-3 within each of the power amplifiers 131b-1 and 131b-2 based on the amplitude value of the constant amplitude signals in a manner similar to that of the first preferred embodiment. Further, the vector phase and vector amplitude value calculating circuit 116 outputs the decided bias point adjustment voltage and power supply voltage to each of the amplifiers 132-2 and 132-3 via the bias point adjustment voltage supply circuit 117b and the voltage control circuit 118b. A bias point adjustment voltage B and a power supply voltage V are applied to each of the amplifiers 132-2 and 132-3, and the amplifiers 132-2 and 132-3 operate accordingly.

The transmission power amplifier apparatus 100a according to the modified preferred embodiment of the first preferred embodiment configured as stated above exhibits the same functions and advantages as those of the first preferred embodiment. Alternatively, different bias point adjustment voltages and power supply voltage may be applied to the respective power amplifiers 132-1 to 132-3 constituting the power amplifier 131b-1. In the first preferred embodiment and the modified preferred embodiment of the first preferred embodiment, both the bias current and the power supply voltage for the M amplifiers 132-m within each of the N power amplifiers 131-n are changed. Alternatively, only one of the bias current and the power supply voltage may be changed.

Second Preferred Embodiment

Figure 17:
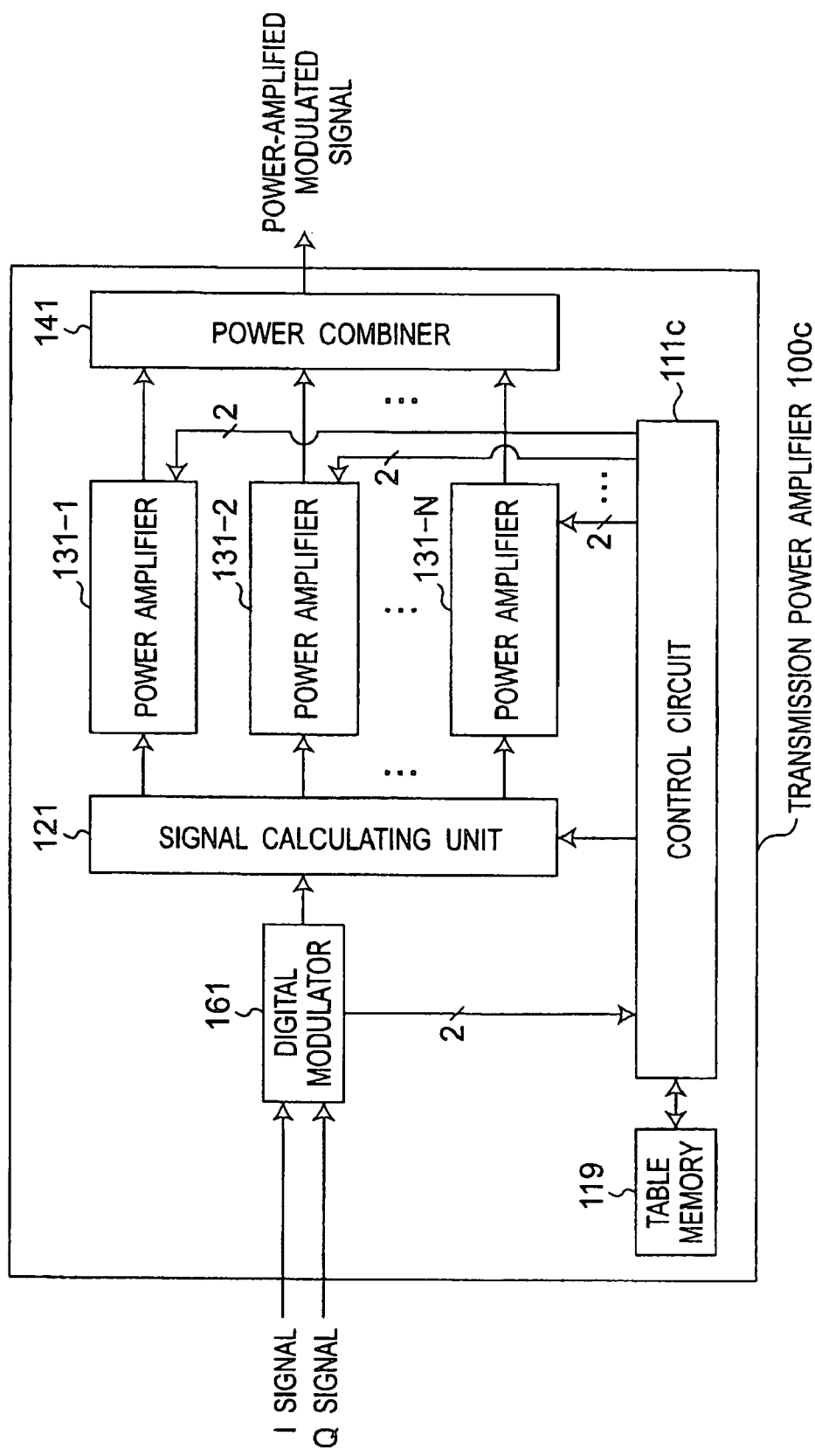
FIG. 17 is a block diagram showing a configuration of a transmission power amplifier apparatus 100$c$ according to a second preferred embodiment of the present invention.
Figure 18:
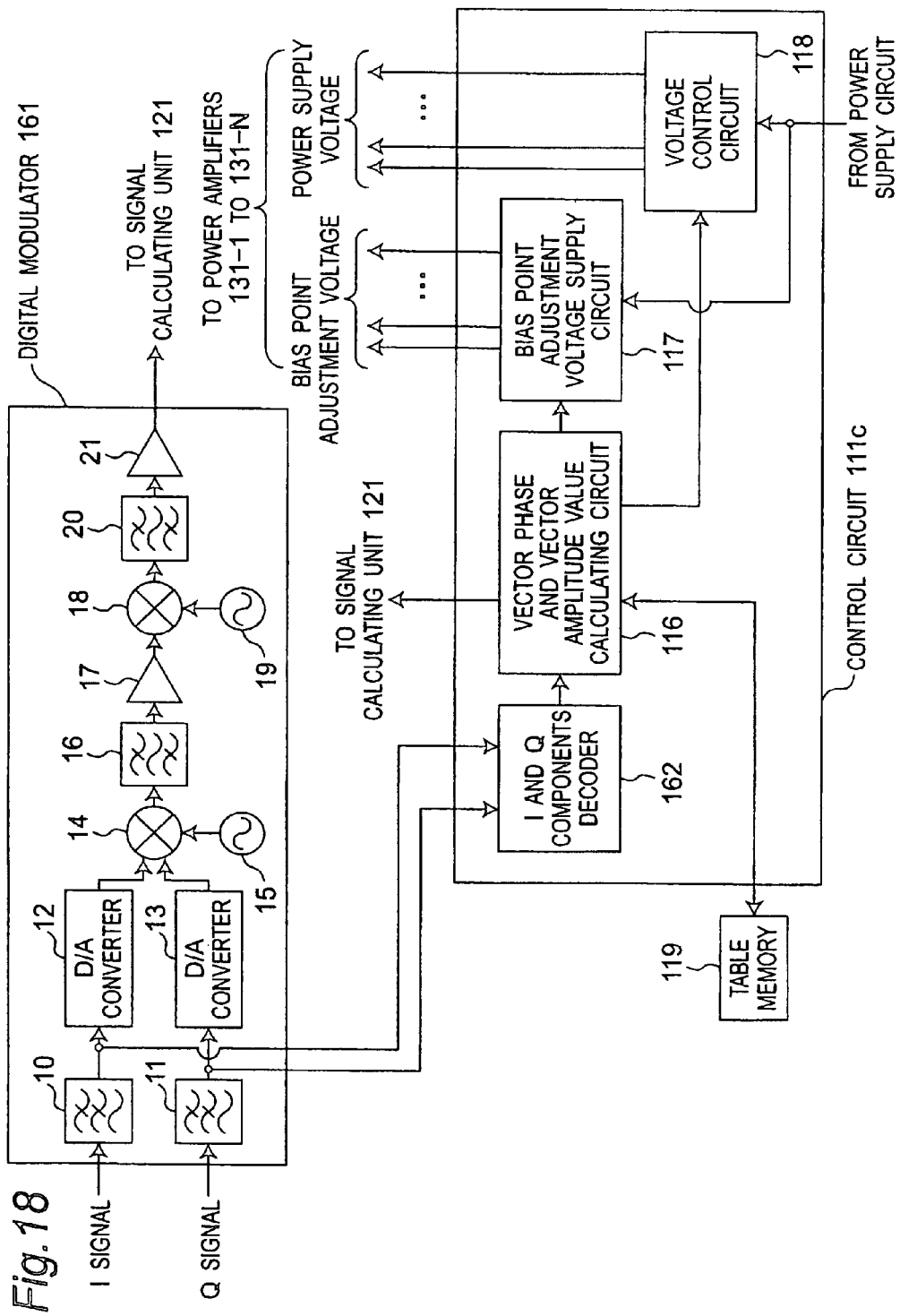
FIG. 18 is a block diagram showing a configuration of a control circuit 111$c$ shown in FIG. 17.

FIG. 17 is a block diagram showing a configuration of a transmission power amplifier apparatus 100c according to a second preferred embodiment of the present invention. FIG. 18 is a block diagram showing a configuration of a control circuit 111c shown in FIG. 17. The transmission power amplifier apparatus 100c according to the second preferred embodiment is characterized, as compared with the transmission power amplifier apparatus 100 according to the first preferred embodiment, by including a control circuit 111c in place of the control circuit 111 and a digital modulator 161 that receives I and Q signals orthogonal to each other in place of the directional coupler 151. The digital modulator 161 low-pass-filters the received I and Q signals, outputs the low-pass-filtered I and Q signals to the control circuit 111c, converts the low-pass-filtered I and Q signals into a digitally modulated signal in which each of a phase component and an amplitude component contains transmission information, and outputs the digitally modulated signal to a signal calculating unit 121. The differences of the second preferred embodiment from the first preferred embodiment will be described.

Referring to FIG. 18, the digital modulator 161 is configured to include a low-pass filter 10 that low-pass-filters the received I signal, a D/A converter 12 that converts the low-pass-filtered I signal into an analog signal, a low-pass filter 11 that low-pass-filters the received Q signal, a D/A converter 13 that converts the low-pass-filtered Q signal into an analog signal, a mixer 14 that combines the signals from the D/A converters 12 and 13, mixes the combined signal with a local oscillation signal from a local oscillator 15, and converts a mixture signal into an intermediate frequency signal, an intermediate frequency filter 16 that band-pass-filters the intermediate frequency signal, an amplifier 17 that amplifies the signal from the intermediate frequency filter 16, and a mixer 18 that mixes the signal from the amplifier 17 with a local oscillation signal from a local oscillator 19, generates a modulated radio signal, and outputs the modulated radio signal to the signal calculating unit 121 via a band-pass filter 20 and an amplifier 21.

Moreover, the control circuit 111c shown in FIG. 18 is characterized, as compared with the control circuit 111 shown in FIG. 2, by including an I and Q components decoder 162 in place of the high-frequency amplitude detector circuit 115. The I and Q components decoder 162 calculates an amplitude value of a modulated signal S(t) based on the low-pass-filtered I and Q signals from the respective low-pass filters 10 and 11 of the digital modulator 161, and detects an average value Aave of an amplitude A(t) of the modulated signal S(t) for a unit time interval and a peak-to-peak value Aw thereof for the unit time interval in a manner similar to that of the first preferred embodiment. Further, the I and Q components decoder 162 calculates a maximum value Amax of the amplitude from the peak-to-peak value Aw in a manner similar to that of the first preferred embodiment, and outputs the maximum value Amax to a vector phase and vector amplitude value calculating circuit 116.

The transmission power amplifier apparatus 100c according to the second preferred embodiment configured as stated above exhibits the same functions and advantages as those of the first preferred embodiment.

Third Preferred Embodiment

Figure 19:
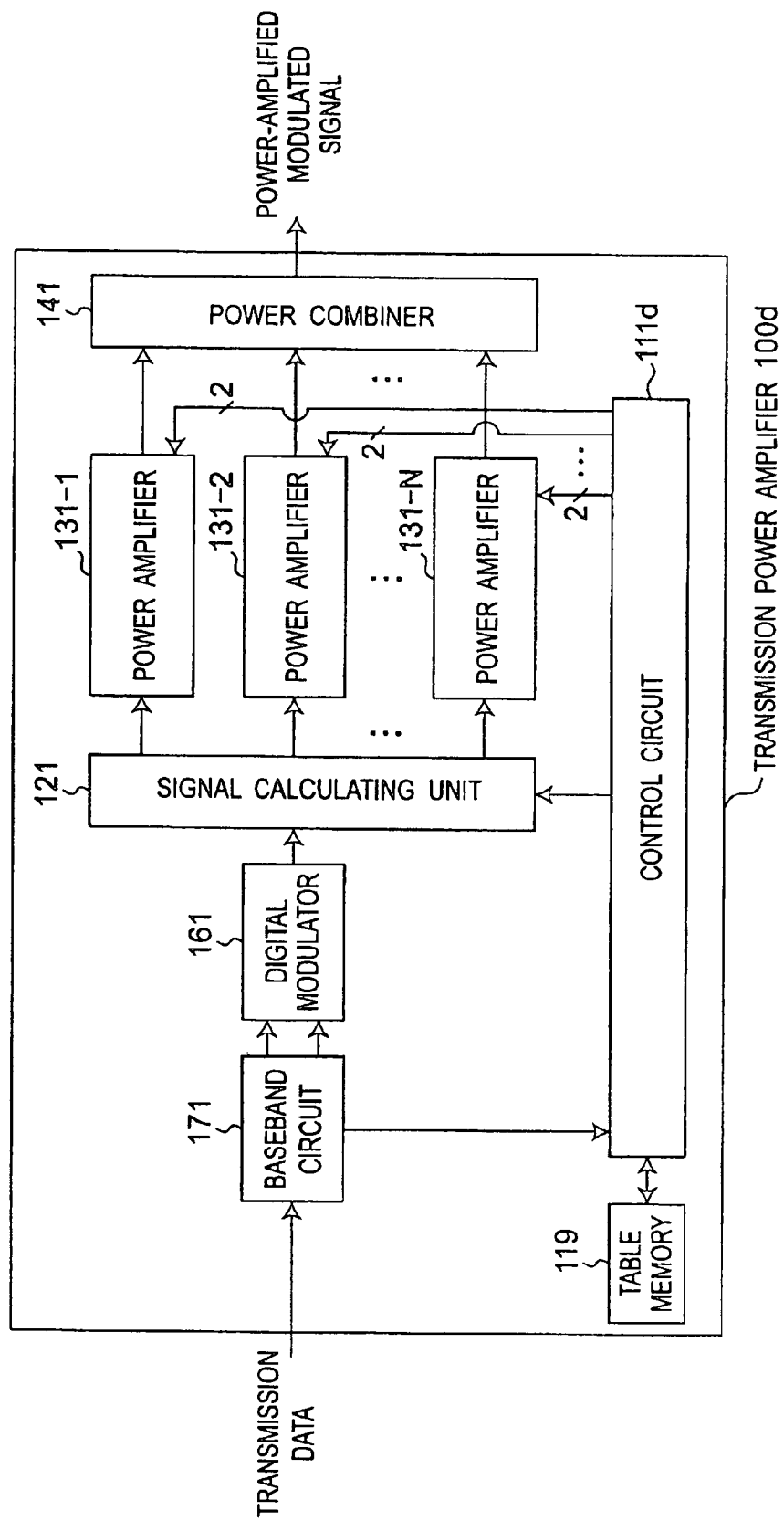
FIG. 19 is a block diagram showing a configuration of a transmission power amplifier apparatus 100$d$ according to a third preferred embodiment of the present invention.
Figure 20:
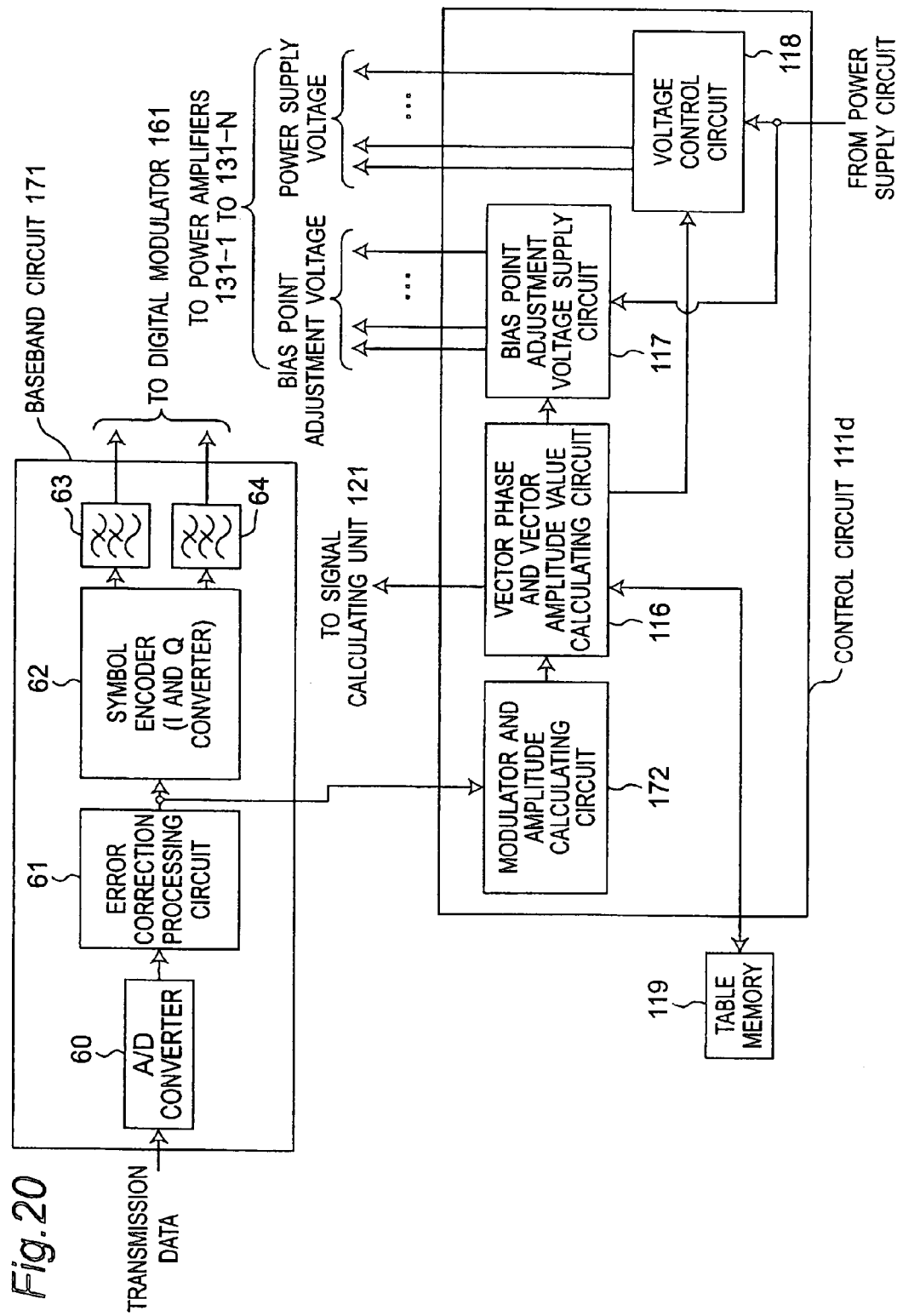
FIG. 20 is a block diagram showing a configuration of a control circuit 111$d$ shown in FIG. 18.

FIG. 19 is a block diagram showing a configuration of a transmission power amplifier apparatus 100d according to a third preferred embodiment of the present invention. FIG. 20 is a block diagram showing a configuration of a control circuit 111d shown in FIG. 19. The transmission power amplifier apparatus 100d according to the third preferred embodiment is characterized, as compared with the transmission power amplifier apparatus 100c according to the second preferred embodiment, by including a control circuit 111d in place of the control circuit 111c and further including a baseband circuit 171. The baseband circuit 171 receives transmission data, generates I and Q signals orthogonal to each other based on the received transmission data, outputs the I and Q signals to a digital modulator 161, and outputs digital data used to generate the I and Q signals to the control circuit 111d. The differences of the third preferred embodiment from the second preferred embodiment will be described.

Referring to FIG. 20, the baseband circuit 171 is configured to include an A/D converter 60 that quantizes the received transmission data, an error correction processing circuit 61 that performs an error correction processing on a signal from the A/D converter 60 and outputs the processed signal to a symbol encoder 62 and to a modulator and amplitude calculating circuit 172 of the control circuit 111d, the symbol encoder 62 that generates the I and Q signals orthogonal to each other based on the signal from the error correction processing circuit 61, and low-pass filters 63 and 64 that low-pass-filter the I and Q signals from the symbol encoder 62 and output the low-pass-filtered I and Q signals to the digital modulator 161, respectively.

Referring further to FIG. 20, the control circuit 111d is characterized, as compared with the control circuit 111c shown in FIG. 18, by including the modulator and amplitude calculating circuit 172 in place of the I and Q components encoder 162. The modulator and amplitude calculating circuit 172 calculates an amplitude value of a modulated signal S(t) based on the digital data from the baseband circuit 171, and detects an average value Aave of an amplitude A(t) of the modulated signal S(t) for a unit time interval and a peak-to-peak value Aw thereof for the unit time interval in a manner similar to that of the first preferred embodiment. Further, the modulator and amplitude calculating circuit 172 calculates a maximum value Amax of the amplitude from the peak-to-peak value Aw in a manner similar to that of the first preferred embodiment, and outputs the calculated maximum value Amax to a vector phase and vector amplitude value calculating circuit 116.

The transmission power amplifier apparatus 100d according to the third preferred embodiment configured as stated above exhibits the same functions and advantages as those of the first preferred embodiment.

Fourth Preferred Embodiment

Figure 21:
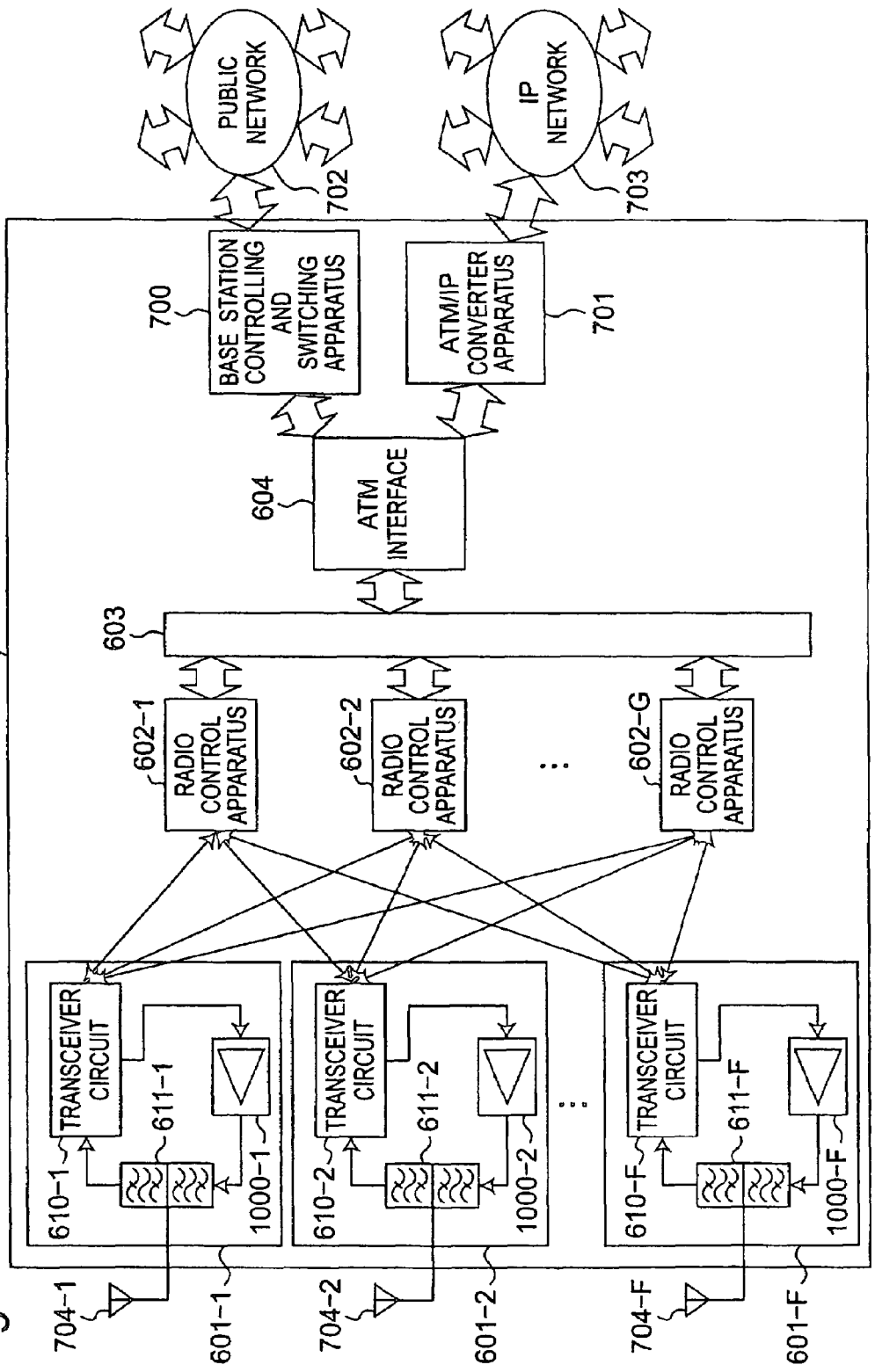
FIG. 21 is a block diagram showing a configuration of a radio communication base station apparatus 600 including a plurality of F transmission power amplifier apparatuses 1000-$f$ (where f=1, 2, ..., F) according to a fourth preferred embodiment of the present invention.

FIG. 21 is a block diagram showing a configuration of a radio communication base station apparatus 600 including a plurality of F transmission power amplifier apparatuses 1000-f (where f=1, 2, ..., F) according to a fourth preferred embodiment of the present invention. The radio communication base station apparatus 600 according to the fourth preferred embodiment is characterized by being configured using the F transmission power amplifier apparatuses 1000-f according to each of the above-stated preferred embodiments.

Referring to FIG. 21, the radio communication base station apparatus 600 is configured to include a plurality of F radio transceiver apparatuses 601-f, a plurality of G radio control apparatuses 602-g (where g=1, 2, ..., G), a bus line 603, an ATM interface 604, a base station controlling and switching apparatus 700, and an ATM/IP converter apparatus 701. Each of the F radio transceiver apparatuses 601-f includes an antenna 704-f, a further sharing unit 611-f, a transceiver circuit 610-f, and a transmission power amplifier apparatus 1000-f.

Referring to FIG. 21, during radio transmission of the radio communication base station apparatus 600,

\*\*\*\* the base station controlling and switching apparatus 700 outputs transmission data from a public network 702 to one radio control apparatus, to which the transmission data is to be transmitted, among the G radio control apparatuses 602-g via the ATM interface 604 and the bus line 603. The ATM/IP converter apparatus 701 outputs the transmission data from an IP network 703 to one radio control apparatus, to which the transmission data is to be transmitted, among the G radio control apparatuses 602-g via the ATM interface 604 and the bus line 603. Further, each of the G radio control apparatuses 602-g outputs the inputted transmission data to one radio transceiver apparatus, to which the inputted transmission data is to be transmitted, among the F radio transceiver apparatuses 601-f. Each of the transceiver circuits 610-f of the F radio transceiver apparatuses 601-f generates a radio transmission signal based on the inputted transmission data, and radio-transmits the generated radio transmission signal via the transmission power amplifier apparatus 1000-f, the filter sharing unit 611-f, and the antenna 704-f.

Referring further to FIG. 21, during radio reception of the radio communication base station apparatus 600, each of the transceiver circuits 610-f of the F radio transceiver apparatuses 601-f receives a radio reception signal via the antenna 704-f and the filter sharing unit 611-f, demodulates the radio reception signal to a baseband signal, and outputs the baseband signal to one radio control apparatus, to which the baseband signal is to be transmitted, among the G radio control apparatuses 602-g. Further, each of the G radio control apparatuses 602-g outputs the inputted baseband signal to a communication terminal apparatus connected to the public network 702 via the bus line 603, the ATM interface 604, the base station controlling and switching apparatus 700, and the public network 702, and to a communication terminal apparatus connected to the IP network 703 via the bus line 603, the ATM interface 604, the ATM/IP converter apparatus 701, and the IP network 703.

The radio communication base station apparatus 600 according to the present preferred embodiment can amplify the power of the transmission radio signal in a wide dynamic range of the signal amplitude with high efficiency and with low power consumption.

In the preferred embodiment stated above, the radio communication base station apparatus 600 includes the base station controlling and switching apparatus 700 and the ATM/IP converter apparatus 701. However, the present invention is not limited to this. The radio communication base station apparatus 600 may include only one of the base station controlling and switching apparatus 700 and the ATM/IP converter apparatus 701.

Fifth Preferred Embodiment

Figure 22:
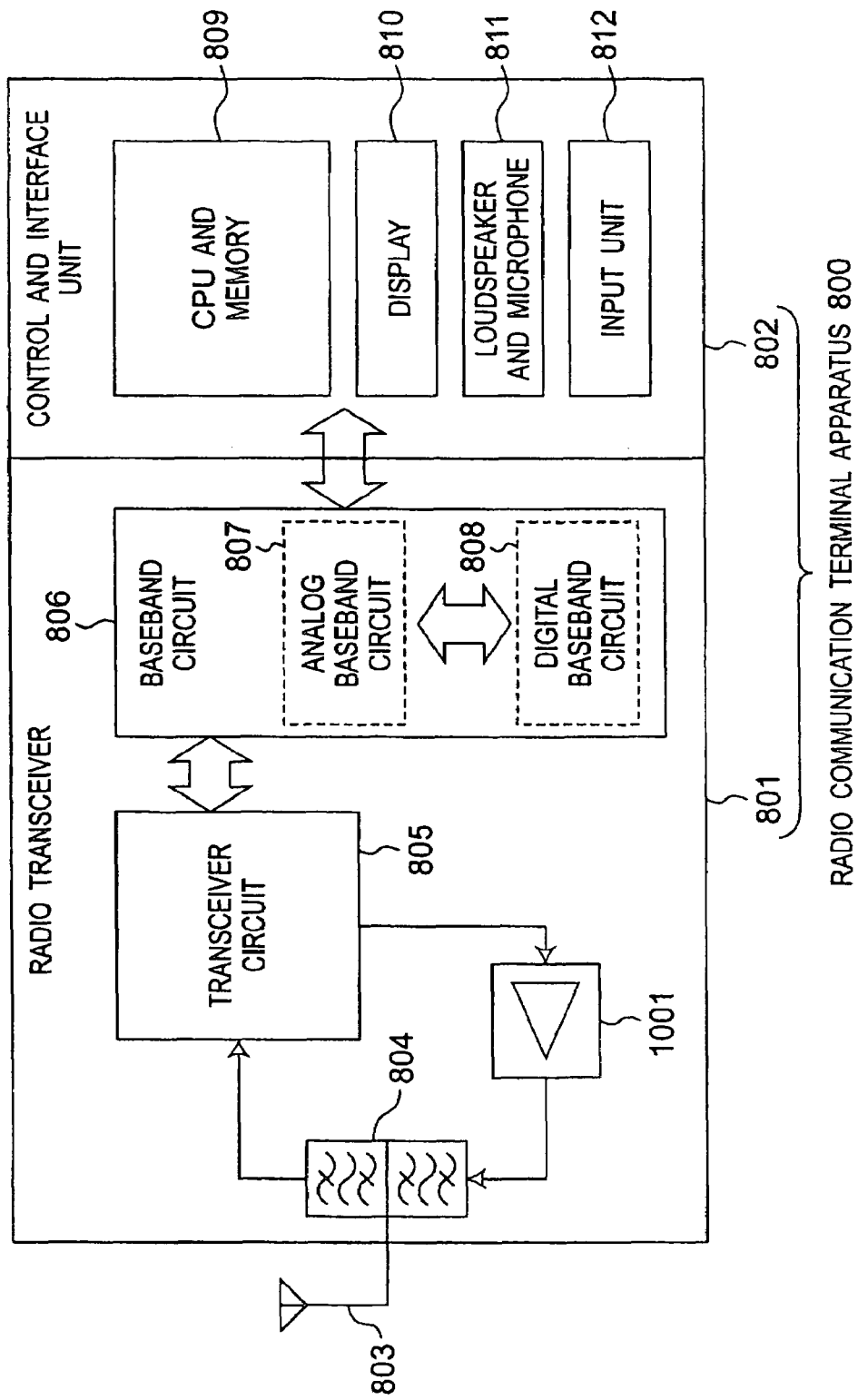
FIG. 22 is a block diagram showing a configuration of a radio communication terminal apparatus 800 including a transmission power amplifier apparatus 1001 according to a fifth preferred embodiment of the present invention.

FIG. 22 is a block diagram showing a configuration of a radio communication terminal apparatus 800 including a transmission power amplifier apparatus 1001 according to a fifth preferred embodiment of the present invention. The radio communication terminal apparatus 800 according to the fifth preferred embodiment is characterized by being configured using the transmission power amplifier apparatus 1001 according to each of the above-stated preferred embodiments.

Referring to FIG. 22, the radio communication terminal apparatus 800 is configured to include a radio transceiver 801 and a control and interface unit 802. The radio transceiver 801 is configured to include an antenna 803, a filter sharing unit 804, a transceiver circuit 805, the transmission power amplifier apparatus 1001, and a baseband circuit 806 that includes an analog baseband circuit 807 and a digital baseband circuit 808. The control and interface unit 802 is configured to include a CPU and memory 809, a display 810, a loudspeaker and microphone 811, and an input unit 812.

During radio transmission of the radio communication terminal apparatus 800, the baseband circuit 806 generates a baseband signal based on transmission data inputted from the CPU and memory 809, the display 810, the loudspeaker and microphone 811 or the input unit 812 of the control and interface unit 802, and outputs the generated baseband signal to the transceiver circuit 805. The transceiver circuit 805 generates a radio transmission signal based on the inputted baseband signal, and radio-transmits the generated radio transmission signal via the transmission power amplifier apparatus 1001, the filter sharing unit 804, and the antenna 803.

During radio reception of the radio communication terminal apparatus 800, the transceiver circuit 805 receives a radio reception signal from a transmitter side via the antenna 803 and the filter sharing unit 804, demodulates the received radio reception signal to a baseband signal, and outputs the baseband signal to the baseband circuit 806. The baseband circuit 806 performs a predetermined processing on the inputted baseband signal, and outputs the processed baseband signal to the CPU and memory 809, the display 810, the loudspeaker and microphone 811 or the input unit 812 of the control and interface unit 802.

Because of being driven by a battery (not shown), the radio communication terminal apparatus 800 needs to operate with low power consumption. The radio communication terminal apparatus 800 according to the present preferred embodiment can amplify the power of the radio transmission signal in a wide dynamic range of the signal amplitude with high efficiency and with low power consumption.

The radio communication terminal apparatus 800 according to the present preferred embodiment includes the transceiver circuit 805. However, the present invention is not limited to this. The radio communication terminal apparatus 800 may include a transmitter circuit that generates a predetermined radio signal and that outputs the radio signal.

In each of the preferred embodiments and the modified preferred embodiments of the preferred embodiments, the table memory 119 is provided outside of the control circuit 111, 111b, 111c or 111d. However, the present invention is not limited to this. The table memory 119 may be provided inside of the control circuit 111, 111b, 111c or 111d and integrated therewith.

In each of the preferred embodiments and the modified preferred embodiments of the preferred embodiments, each of the amplifiers 132-1 to 132-M is the emitter-grounded transistor power amplifier circuit. However, the present invention is not limited to this. Each of the amplifiers 132-1 to 132-M may be a transistor power amplifier circuit in the other grounding form or a power amplifier circuit using the other active element such as a field-effect transistor. For example, when each of the amplifiers 132-1 to 132-M is a power amplifier circuit using a unipolar transistor such as a field-effect transistor, then the bias point can be changed by changing a gate voltage, and the power supply voltage can be changed by changing a drain voltage.

As stated so far in detail, the transmission power amplifier apparatus according to the present invention is useful as the transmission power amplifier apparatus that can amplify the power of the input signal with high efficiency substantially linearly even if the dynamic range of the amplitude of the input signal is relatively wide or the PAR thereof is relatively large.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A transmission power amplifier apparatus comprising:
    a signal calculator for dividing an input signal into a plurality of N constant amplitude signals having a substantially identical predetermined constant amplitude value and having predetermined phases different from each other;
    N power amplifiers for amplifying electric powers of the N constant amplitude signals under same predetermined operating condition;
    a power combiner for combining the electric powers of the N power-amplified constant amplitude signals, and outputting a combined output signal; and
    a controller for controlling the signal calculator,
    (a) to detect an amplitude value of the input signal,
    (b) to detect an average value and one of a maximum value of the amplitude value of the input signal and a peak-to-peak value of the amplitude value for a unit time interval based on the detected amplitude value of the input signal,
    (c) to decide the constant amplitude value of the N constant amplitude signals for the unit time interval so as to suppress a combined loss caused by the power combiner based on the detected average value and one of the detected maximum value and the detected peak-to-peak value,
    (d) to decide the phases of the N constant amplitude signals so as to divide the input signal into the N constant amplitude signals having the decided constant amplitude value and the decided different phases based on the decided constant amplitude value and the amplitude value of the input signal, and
    (e) to divide the input signal into the N constant amplitude signals having the decided constant amplitude value and the decided different phases.

2. The transmission power amplifier apparatus as claimed in claim 1, further comprising:
    a table memory for previously storing a first lookup table and a second lookup table, the first lookup table showing a relationship between the detected average value and maximum value or the detected peak-to-peak value and the constant amplitude value of the N constant amplitude signals, the second lookup table showing a relationship of the constant amplitude value and the amplitude value of the input signal to each of the phases of the N constant amplitude signals, wherein the controller decides the constant amplitude value of the N constant amplitude signals and the phases of the N constant amplitude signals with reference to the first lookup table and the second lookup table.

3. The transmission power amplifier apparatus as claimed in claim 1, wherein the controller decides the constant amplitude value of the N constant amplitude signals and the phases of the N constant amplitude signals by calculation.

4. The transmission power amplifier apparatus as claimed in claim 1, wherein the controller controls the N power amplifiers to decide the operating condition for the N power amplifiers for the unit time interval so that the N power amplifiers operate near a maximum efficient point based on the decided constant amplitude value.

5. The transmission power amplifier apparatus as claimed in claim 1, wherein the operating condition for the N power amplifiers is at least one of bias points of the respective N power amplifiers and power supply voltages of the respective N power amplifiers.

6. The transmission power amplifier apparatus as claimed in claim 1, wherein each of the N power amplifiers includes a plurality of amplifier connected in series.

7. The transmission power amplifier apparatus as claimed in claim 1, wherein each of the N power amplifiers includes a plurality of amplifier connected in parallel.

8. The transmission power amplifier apparatus as claimed in claim 1, further comprising:

a digital modulator for converting an I signal and a Q signal orthogonal to each other into a modulated signal, and outputting the modulated signal to the signal calculator as the input signal, wherein the controller includes an I and Q components decoder for detecting the amplitude value of the input signal based on the I and Q signals.

9. The transmission power amplifier apparatus as claimed in claim 1, further comprising:

a baseband processor for converting inputted digital data into an I signal and a Q signal orthogonal to each other, and outputting the I and Q signals; and a digital modulator for converting the I and Q signals from the baseband processor into a modulated signal, and outputting the modulated signal to the signal calculator as the input signal, wherein the controller includes a modulated amplitude calculator for detecting the amplitude value of the input signal based on the digital data.

10. A method of controlling a transmission power amplifier apparatus including steps of:

performing a signal calculating processing for dividing an input signal into a plurality of N constant amplitude signals having a substantially identical predetermined constant amplitude value and having predetermined phases different from each other;

amplifying electric powers of the N constant amplitude signals under substantially the same predetermined operating condition, respectively;

combining the electric powers of the N power-amplified constant amplitude signals, and outputting a combined output signal;

controlling the step of performing the signal calculating processing, (a) to detect an amplitude value of the input signal, (b) to detect an average value and one of a maximum value of the amplitude value of the input signal and a peak-to-peak value of the amplitude value for a unit time interval based on the detected amplitude value of the input signal, (c) to decide the constant amplitude value of the N constant amplitude signals for the unit time interval so as to suppress a combined loss at the step of combining the electric powers based on the detected average value and one of the detected maximum value and the detected peak-to-peak value, (d) to decide the phases of the N constant amplitude signals so as to divide the input signal into the N constant amplitude signals having the decided constant amplitude value and the decided different phases based on the decided constant amplitude value and the amplitude value of the input signal, and (e) to divide the input signal into the N constant amplitude signals having the decided constant amplitude value and the decided different phases.

11. A radio communication apparatus comprising:

a transmitter circuit for generating and outputting a predetermined radio signal; and a transmission power amplifier apparatus for amplifying an electric power of the radio signal from the transmitter circuit, wherein the transmission power amplifier apparatus comprises:

a signal calculator for dividing an input signal which is the radio signal, into a plurality of N constant amplitude signals having a substantially identical predetermined constant amplitude value and having predetermined phases different from each other;

N power amplifiers for amplifying electric powers of the N constant amplitude signals under same predetermined operating condition;

a power combiner for combining the electric powers of the N power-amplified constant amplitude signals, and outputting a combined output signal; and a controller for controlling the signal calculator, (a) to detect an amplitude value of the input signal, (b) to detect an average value and one of a maximum value of the amplitude value of the input signal and a peak-to-peak value of the amplitude value for a unit time interval based on the detected amplitude value of the input signal, (c) to decide the constant amplitude value of the N constant amplitude signals for the unit time interval so as to suppress a combined loss caused by the power combiner based on the detected average value and one of the detected maximum value and the detected peak-to-peak value, (d) to decide the phases of the N constant amplitude signals so as to divide the input signal into the N constant amplitude signals having the decided constant amplitude value and the decided different phases based on the decided constant amplitude value and the amplitude value of the input signal, and (e) to divide the input signal into the N constant amplitude signals having the decided constant amplitude value and the decided different phases.

12. A radio communication apparatus comprising:

a transceiver circuit for generating and outputting a predetermined radio signal, and receiving a radio signal from a transmitter side; and a transmission power amplifier apparatus for amplifying an electric power of the radio signal from the transceiver circuit, wherein the transmission power amplifier apparatus comprises:

a signal calculator for dividing an input signal which is the radio signal, into a plurality of N constant amplitude signals having a substantially identical predetermined constant amplitude value and having predetermined phases different from each other;

N power amplifiers for amplifying electric powers of the N constant amplitude signals under same predetermined operating condition;

a power combiner for combining the electric powers of the N power-amplified constant amplitude signals, and outputting a combined output signal; and a controller for controlling the signal calculator, (a) to detect an amplitude value of the input signal, (b) to detect an average value and one of a maximum value of the amplitude value of the input signal and a peak-to-peak value of the amplitude value for a unit time interval based on the detected amplitude value of the input signal, (c) to decide the constant amplitude value of the N constant amplitude signals for the unit time interval so as to suppress a combined loss caused by the power combiner based on the detected average value and one of the detected maximum value and the detected peak-to-peak value, (d) to decide the phases of the N constant amplitude signals so as to divide the input signal into the N constant amplitude signals having the decided constant amplitude value and the decided different phases based on the decided constant amplitude value and the amplitude value of the input signal, and (e) to divide the input signal into the N constant amplitude signals having the decided constant amplitude value and the decided different phases.

* * * * *